(12) United States Patent
Kadowaki et al.

(10) Patent No.: US 11,982,902 B2
(45) Date of Patent: May 14, 2024

(54) LIGHT-EMITTING DEVICE INCLUDING POLARIZED LIGHT CONTROL MEMBER

(71) Applicant: NICHIA CORPORATION, Anan (JP)

(72) Inventors: Takuya Kadowaki, Yokohama (JP); Tadashi Kawazoe, Atsugi (JP); Masaki Sugeta, Yokohama (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/898,081

(22) Filed: Aug. 29, 2022

(65) Prior Publication Data
US 2023/0061261 A1 Mar. 2, 2023

(30) Foreign Application Priority Data
Aug. 31, 2021 (JP) .................. 2021-141810

(51) Int. Cl.
G02F 1/13357 (2006.01)
H01L 25/075 (2006.01)
H01L 33/50 (2010.01)
H01L 33/58 (2010.01)

(52) U.S. Cl.
CPC .... *G02F 1/133603* (2013.01); *H01L 25/0753* (2013.01); *H01L 33/504* (2013.01); *H01L 33/58* (2013.01)

(58) Field of Classification Search
CPC ........... G02F 1/133603; G02F 1/13362; H01L 25/0753; H01L 33/504; H01L 33/58
See application file for complete search history.

(56) References Cited

U.S. PATENT DOCUMENTS

| 2007/0297061 | A1* | 12/2007 | Kyomoto ............... G03B 21/14 359/618 |
| 2008/0054283 | A1 | 3/2008 | Min et al. |
| 2015/0144979 | A1 | 5/2015 | Jin et al. |
| 2017/0089546 | A1 | 3/2017 | Verschuuren et al. |
| 2017/0343739 | A1* | 11/2017 | Bauters ................... G02B 6/27 |
| 2017/0350563 | A1 | 12/2017 | Lunz et al. |
| 2019/0113727 | A1 | 4/2019 | Tamma |

(Continued)

FOREIGN PATENT DOCUMENTS

| JP | 2008-060534 A | 3/2008 |
| JP | 2008-122618 A | 5/2008 |

(Continued)

*Primary Examiner* — Tracie Y Green
(74) *Attorney, Agent, or Firm* — Foley & Lardner LLP

(57) ABSTRACT

A light-emitting device includes at least one light-emitting element including a semiconductor layered portion and configured to emit light that has a predetermined wavelength and includes a first polarization component and a second polarization component; and at least one polarized light control member in contact with the at least one light-emitting element. The at least one polarized light control member includes a first structure and a second structure that are positioned in order from the at least one light-emitting element side. The first structure receives the light having the predetermined wavelength to generate near-field light. The second structure receives the near-field light and the light having the predetermined wavelength to emit light in which a proportion of the second polarization component is greater than a proportion of the first polarization component.

13 Claims, 20 Drawing Sheets

(56) References Cited

U.S. PATENT DOCUMENTS

| | | | |
|---|---|---|---|
| 2020/0124953 A1* | 4/2020 | Miura | H01S 5/02208 |
| 2021/0181616 A1* | 6/2021 | Akiyama | G03B 21/204 |

FOREIGN PATENT DOCUMENTS

| | | | |
|---|---|---|---|
| JP | 2009-251128 A | 10/2009 | |
| JP | 2010-156871 A | 7/2010 | |
| JP | 2012-093620 A | 5/2012 | |
| JP | 2012-189651 A | 10/2012 | |
| JP | 2015-103797 A | 6/2015 | |
| JP | 2017-517891 A | 6/2017 | |
| JP | 2019-519895 A | 7/2019 | |
| JP | 2019-176105 A | 10/2019 | |
| JP | 2019-176106 A | 10/2019 | |
| JP | 2020-537828 A | 12/2020 | |
| JP | 2021-009404 A | 1/2021 | |

\* cited by examiner

LIGHT-EMITTING DEVICE INCLUDING POLARIZED LIGHT CONTROL MEMBER

CROSS REFERENCE TO RELATED APPLICATION

This application claims priority to Japanese Patent Applications No. 2021-141810, filed on Aug. 31, 2021, the entire contents of which are hereby incorporated by reference.

BACKGROUND

The present disclosure relates to a light-emitting device and a display.

With the use of a polarizer, for example, light polarized in a single direction can be obtained from unpolarized light. Japanese Patent Application Publication 2012-189651 A discloses a polarization conversion plate configured to convert unpolarized light into such polarized light by using near-field light.

SUMMARY

A novel light-emitting device configured to emit polarized light having a proportion of a certain polarization component greater than a proportion of another polarization component is desired.

A light-emitting device according to one embodiment of the present disclosure includes: at least one light-emitting element including a semiconductor layered portion and being configured to emit light having a predetermined wavelength and including a first polarization component and a second polarization component; and at least one polarized light control member in contact with the at least one light-emitting element. The at least one polarized light control member includes a first structure and a second structure that are positioned in order from the at least one light-emitting element side. The first structure receives the light having the predetermined wavelength to generate near-field light. The second structure receives the near-field light and the light having the predetermined wavelength.

A light-emitting device according to another embodiment of the present disclosure includes at least one light-emitting element comprising a semiconductor layered portion and being configured to emit light that has a predetermined wavelength and includes a first polarization component and a second polarization component; and at least one polarized light control member in contact with the at least one light-emitting element. The at least one polarized light control member includes a first structure and a second structure positioned in order from the light-emitting element side. In the first structure and the second structure, a length in a height direction perpendicular to a light-emitting surface of the light-emitting element, a length in a vertical direction perpendicular to the height direction, and a length in a horizontal direction perpendicular to both of the height direction and the vertical direction are less than the predetermined wavelength. A distance between the first structure and the second structure is less than the predetermined wavelength. A ratio of a length of the second structure in the horizontal direction to a length of the second structure in the vertical direction is greater than 1.

According to certain embodiments of the present disclosure, a novel light-emitting device is configured to emit, by using near-field light, polarized light having a proportion of a certain polarization component greater than a proportion of another polarization component.

DETAILED DESCRIPTION

Figure 1A:
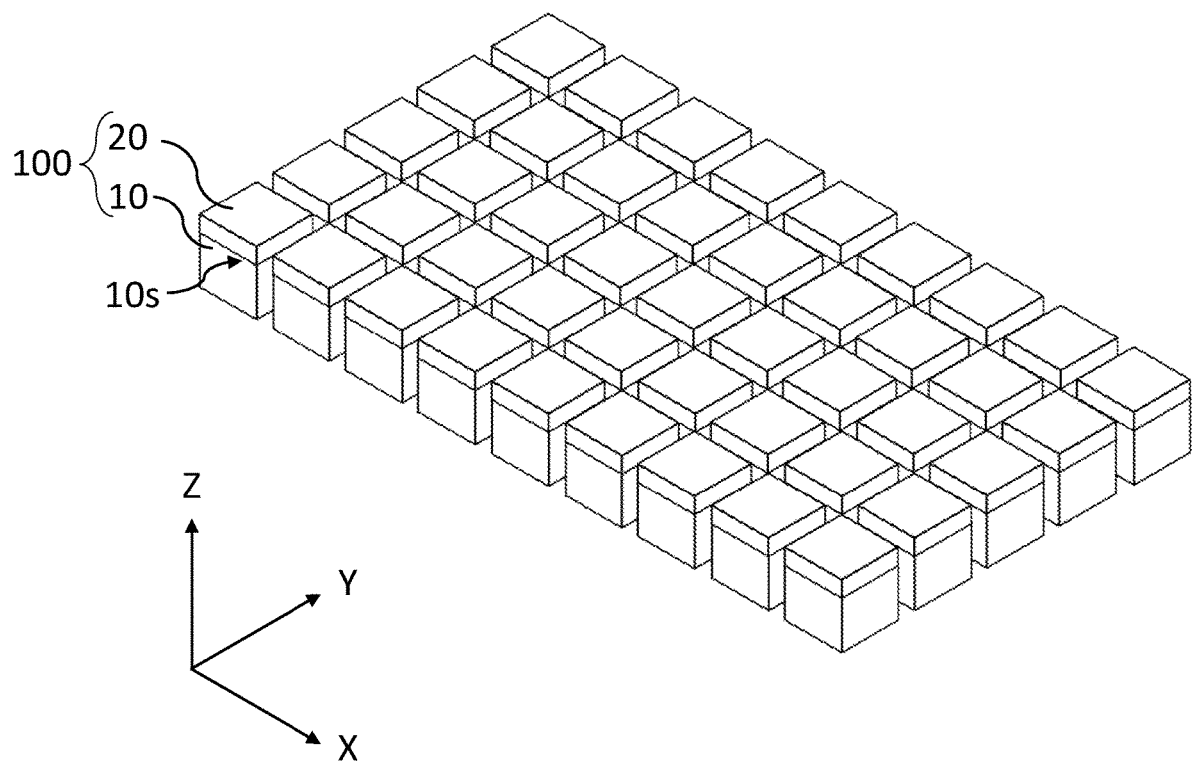
FIG. 1A is a schematic perspective view illustrating a configuration example of a light-emitting device according to an embodiment of the present disclosure.

A light-emitting device according to an embodiment of the present disclosure will be described in detail below with reference to the drawings. Parts having the same reference numerals appearing in a plurality of drawings indicate identical or equivalent parts.

The following examples are described to give a concrete form to the technical ideas of the present disclosure. However, the present disclosure is not limited to the described examples. In addition, the dimensions, materials, shapes, relative arrangements, and the like of components are mere examples, and the present invention is not intended to be limited to those examples. The size, positional relationship, and the like of the members illustrated in the drawings may be exaggerated to facilitate understanding and the like.

In this specification or the scope of the claims, polygons such as triangles and quadrangles, including shapes with modifications at corners (i.e., ends of sides) and/or intermediate portions of sides of the polygon, such as rounded corners, slanted corners, inverse-rounded corners, and the like, are referred to as polygons.

In the drawings, an X-axis, a Y-axis, and a Z-axis that are mutually orthogonal are illustrated for reference. In this specification, a direction of an arrow in the Z-axis is referred to as "upward." This does not limit the orientation of the light-emitting device during use.

Further, in this specification or the scope of the claims, when there are a plurality of components corresponding to a certain component and each of the components is to be expressed separately, the components may be distinguished by adding the terms "first" and "second" in front of the component term. When distinguished objects or viewpoints differ between this specification and the scope of the claims, the same added terms in the specification and the scope of the claims may not refer to the same objects.

Embodiments

A light-emitting device according to an embodiment of the present disclosure includes at least one light-emitting element including a semiconductor layered portion and being configured to emit light having a predetermined wavelength and including a first polarization component and a second polarization component, and at least one polarized light control member in contact with the light-emitting element. The polarized light control member includes a first structure and a second structure positioned in order from the light-emitting element side. The first structure receives the light having the predetermined wavelength to generate near-field light. The second structure receives the near-field light and the light having the predetermined wavelength to emit light having a proportion of the second polarization component greater than a proportion of the first polarization component.

A light-emitting device according to one embodiment of the present disclosure includes at least one light-emitting element including a semiconductor layered portion and being configured to emit light having a predetermined wavelength and including a first polarization component and a second polarization component, and at least one polarized light control member in contact with the light-emitting element. The polarized light control member includes a first structure and a second structure located in order from the light-emitting element side. In each of the first structure and the second structure, a length in a height direction perpendicular to a light-emitting surface of the light-emitting element, a length in a vertical direction perpendicular to the height direction, and a length in a horizontal direction perpendicular to both of the height direction and the vertical direction are less than the predetermined wavelength. A distance between the first structure and the second structure is less than the predetermined wavelength. A ratio of a length of the second structure in the horizontal direction to a length of the second structure in the vertical direction is greater than 1. The light-emitting device according to one embodiment of the present disclosure having a configuration as described above can emit light having a proportion of the second polarization component greater than a proportion of the first polarization component.

Basic Configuration Example of Light-Emitting Device

With reference to FIGS. 1A to 1D, a basic configuration example of a light source device including a plurality of light-emitting devices according to one embodiment of the present disclosure will be described. The light-emitting device according to the present embodiment emits, by using near-field light, polarized light having a proportion of one polarization component greater than a proportion of another polarization component, of two polarization components orthogonal to each other. In the present embodiment, the light source device including the plurality of light-emitting devices may be, for example, a white backlight. The white backlight may be attached to a liquid crystal panel, for example. The light-emitting device according to the present embodiment is not limited to a white backlight, and may also be employed for, for example, a monochromatic polarization light source.

FIG. 1A is a schematic perspective view illustrating a configuration example of the light source device including the light-emitting device according to the embodiment of the present disclosure. A light-emitting device 100 illustrated in FIG. 1A includes a light-emitting element 10 including a light-emitting surface 10s, and a polarized light control member 20 in contact with the light-emitting surface 10s. Light emitted from the light-emitting surface 10s is emitted to the outside through the polarized light control member 20. In this specification, the expression that two objects are in contact with each other encompasses not only a case in which the two objects are directly bonded together without a bonding material therebetween, but also a case in which a bonding material is present between the two objects. In the example illustrated in FIG. 1A, a height direction perpendicular to each light-emitting surface 10s is parallel to a Z direction, a vertical direction perpendicular to the height direction is parallel to a Y direction, and a horizontal direction perpendicular to both of the height direction and the vertical direction is parallel to an X direction.

While a plurality of light-emitting elements 10 are periodically arrayed in the example illustrated in FIG. 1A, the plurality of light-emitting elements 10 may be irregularly arrayed. In this case, the polarized light control members 20 in contact with the light-emitting surfaces 10s of the plurality of light-emitting elements 10 are also irregularly arrayed. The plurality of light-emitting elements 10 and the plurality of polarized light control members 20 are arrayed at intervals in the example illustrated in FIG. 1A, but may be arrayed without gaps. While forty-five light-emitting elements 10 are disposed in the example illustrated in FIG. 1A, at least one light-emitting element 10 may be disposed. For example, the number of the light-emitting elements 10 may be an order in a range of $10^2$ to $10^5$. Each of the light-emitting elements may have any appropriate length in the X direction, and may have a length, for example, in a range of 50 μm to 1 cm in the X direction. The same also applies to a length of each of the light-emitting elements 10 in the Y direction. Lengths of each of the polarized light control members 20 in the X direction and the Y direction are approximately equal to the lengths of a respective one of the light-emitting elements 10 in the X direction and the Y direction, respectively. The number of the polarized light control members 20 can be set equal to the number of the light-emitting elements 10. In the example illustrated in FIG. 1A, each of the plurality of light-emitting surfaces 10s is a flat surface parallel to an XY plane, but some or all of the light-emitting surfaces 10s may be a curved surface.

The plurality of light-emitting elements 10 in the present embodiment may include, for example, three types of light-emitting elements configured to emit red light, green light, and blue light, respectively. The light emitted from each of the light-emitting elements includes a first polarization component and a second polarization component orthogonal to the first polarization component, and is in an unpolarized state as a whole. In this specification, the term "unpolarized" encompasses not only a case in which energy in two polarization components orthogonal to each other is strictly 50% of the whole energy, but also a case in which energy in one polarization component is equal to or more than 49% and less than 50% of the whole energy and energy in the other polarization component is the rest of the whole energy.

Figure 1B:
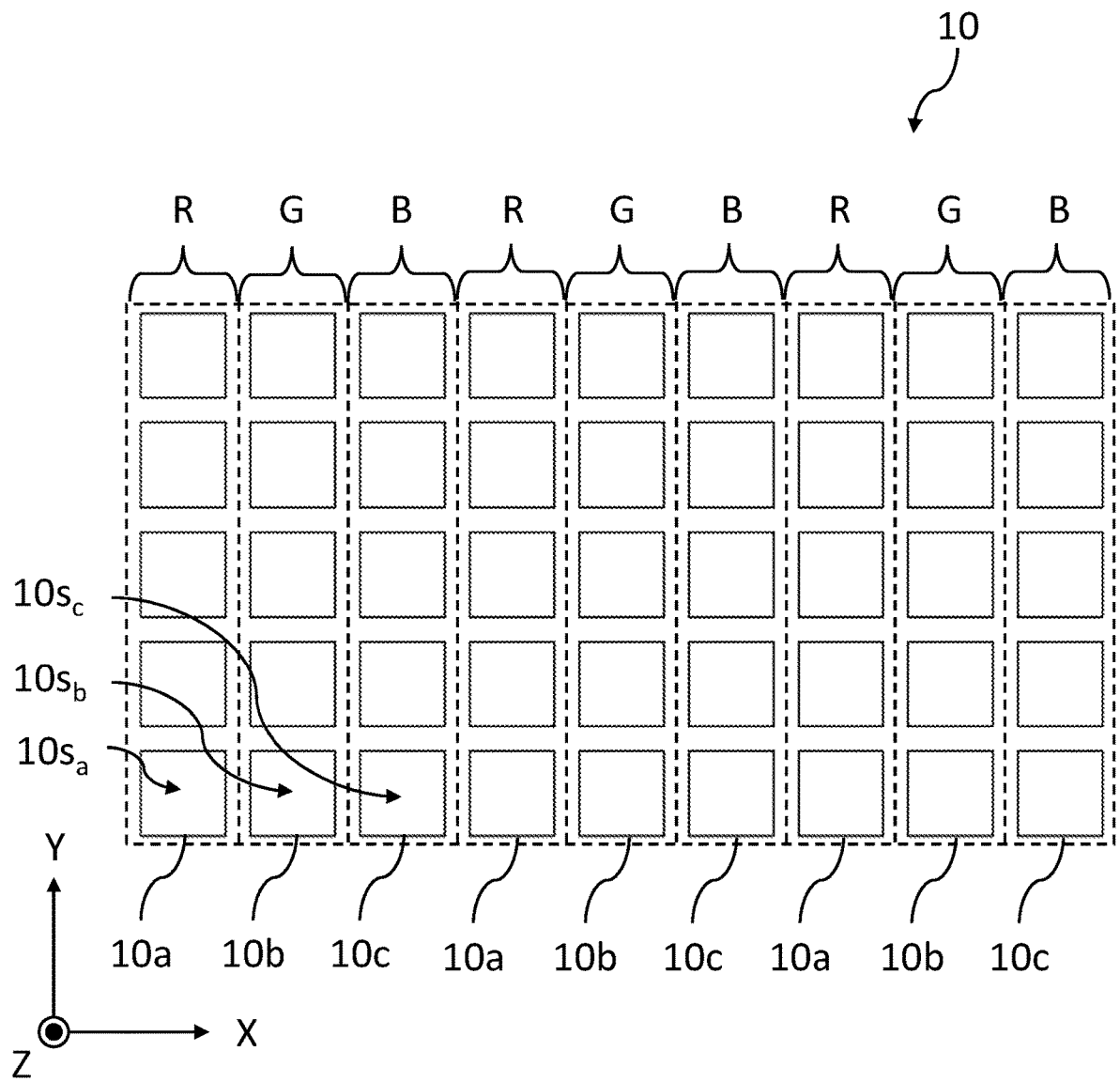
FIG. 1B is a schematic top view illustrating an example of an arrangement of three types of light-emitting elements included in a plurality of light-emitting elements illustrated in FIG. 1A.

FIG. 1B is a schematic top view illustrating an example of an arrangement of three types of light-emitting elements included in the plurality of light-emitting elements 10 illustrated in FIG. 1A. In FIG. 1B, illustrations of components other than the plurality of light-emitting elements 10 are omitted. Each column demarcated by a broken line illustrated in FIG. 1B represents an array of light-emitting elements configured to emit red light, green light, or blue light. A first column represented by "R" includes a plurality of first light-emitting elements 10a that are aligned along the Y direction and configured to emit unpolarized red light. Similarly, a second column represented by "G" includes a plurality of second light-emitting elements 10b that are aligned along the Y direction and configured to emit unpolarized green light. Similarly, a third column represented by "B" includes a plurality of third light-emitting elements 10c that are aligned along the Y direction and configured to emit unpolarized blue light. The first, second, and third columns are repeatedly aligned in this order along the X direction. In the example illustrated in FIG. 1B, the number of the light-emitting elements included in each column and aligned along the Y direction is five, but may be, for example, on the order of 10 to $10^2$ when using for a white backlight.

Figure 1C:
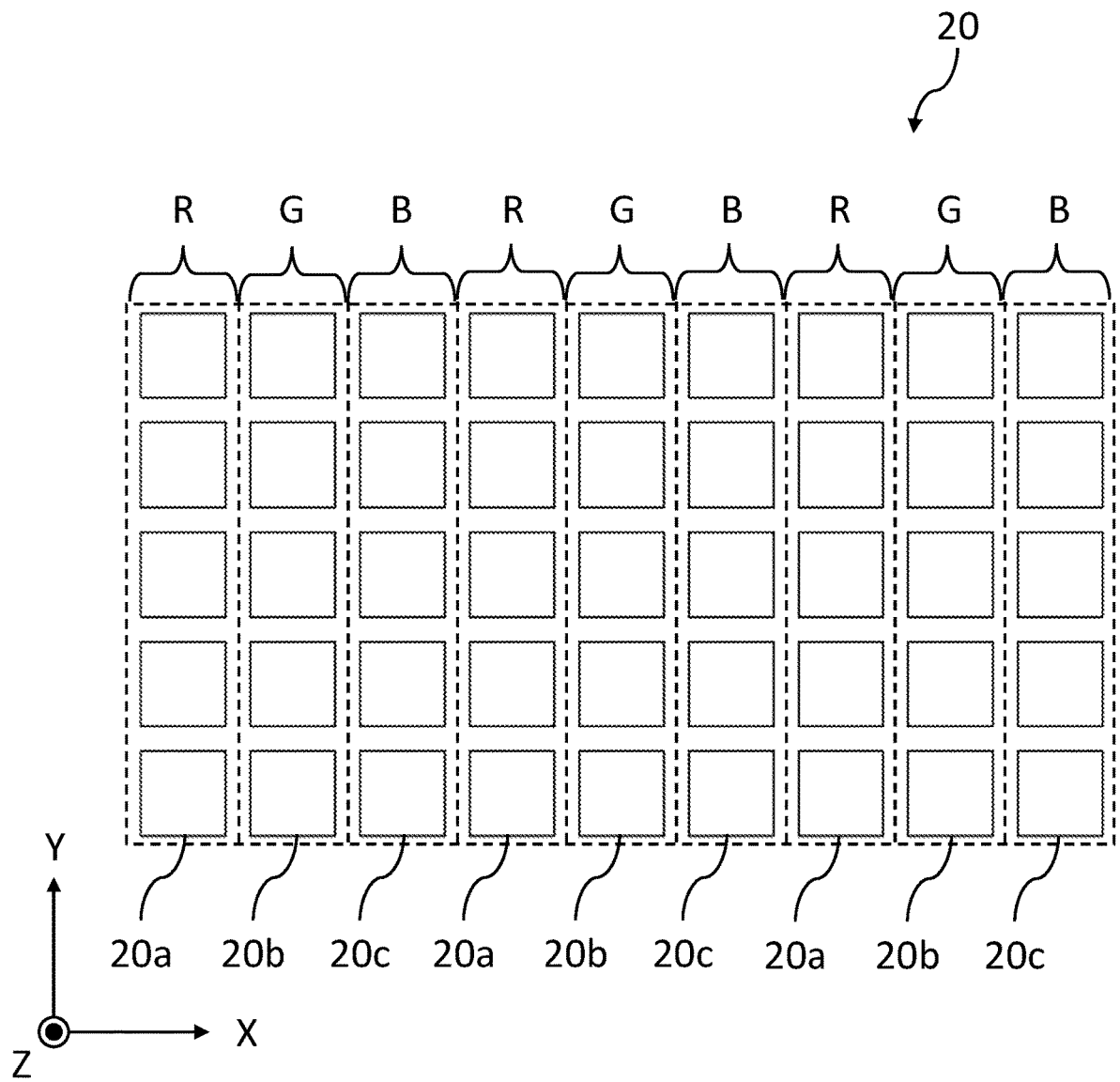
FIG. 1C is a schematic top view illustrating an example of an arrangement of three types of polarized light control members included in a plurality of polarized light control members illustrated in FIG. 1A.

The plurality of polarized light control members 20 in the present embodiment may include, for example, three types of polarized light control members corresponding respectively to three types of light-emitting elements. FIG. 1C is a schematic top view illustrating an example of an arrangement of three types of polarized light control members included in the plurality of polarized light control members 20 illustrated in FIG. 1A. The first light-emitting element 10a, the second light-emitting element 10b, and the third light-emitting element 10c illustrated in FIG. 1B are located directly below a first polarized light control member 20a, a second polarized light control member 20b, and a third polarized light control member 20c illustrated in FIG. 1C, respectively.

The first polarized light control member 20a can receive unpolarized light having a predetermined wavelength and emitted from the first light-emitting element 10a and emit the light having the predetermined wavelength having the second polarization component greater than the first polarization component. The same also applies to the second polarized light control member 20b and the third polarized light control member 20c.

Each polarized light control member is in contact with the light-emitting element located directly below the polarized light control member. With this structure, each polarized light control member can efficiently receive unpolarized light emitted from the light-emitting element located directly below the polarized light control member, and can extract, from the unpolarized light, light having a proportion of the second polarization component greater than a proportion of the first polarization component.

Further, each polarized light control member in contact with the light-emitting element located directly below the polarized light control member, which allows for obtaining a separate polarized light control member for each element.

In the following description, the expression "proportion of the second polarization component is greater than a proportion of the first polarization component" refers to that polarized light has energy in one polarization direction of two polarization directions orthogonal to each other exceeding 50% of energy of unpolarized light, and energy in the other polarization direction of the two polarization directions less than 50% of the energy of the unpolarized light. A specific configuration of the first polarized light control member 20a, the second polarized light control member 20b, and the third polarized light control member 20c will be described below.

In this specification, the "predetermined wavelength" is equal to or greater than a wavelength on a short side and equal to or less than a wavelength on a long side, of two wavelengths at which intensity of light emitted from each light-emitting element is half of intensity of a peak wavelength. For other wavelengths, contribution of near-field light to conversion from unpolarized light into polarized light is small enough to be negligible. In this specification, red light may have a peak wavelength of 605 nm or greater and 750 nm or less, for example, and preferably 610 nm or greater and 700 nm or less. Yellow light may have a peak wavelength of 575 nm or greater and less than 605 nm, for example. Green light may have a peak wavelength of 495 nm or greater and less than 575 nm, for example, and preferably 510 nm or greater and 550 nm or less. Blue light may have a peak wavelength of 420 nm or greater and less than 495 nm, for example, and preferably 440 nm or greater and 475 nm or less. Purple light may have a peak wavelength of 380 nm or greater and less than 420 nm, for example. Ultraviolet light may have a peak wavelength of 200 nm or greater and less than 380 nm, for example. A difference between the wavelength on the long side and the wavelength on the short side, i.e., a full width at half maximum, of light emitted from each light-emitting element may be, for example, 10 nm or greater and 50 nm or less. In this specification, predetermined wavelengths of light emitted from the first light-emitting element 10a, the second light-emitting element 10b, and the third light-emitting element 10c are also referred to as a "first wavelength," a "second wavelength," and a "third wavelength," respectively. These wavelengths are different from each other.

Figure 1D:
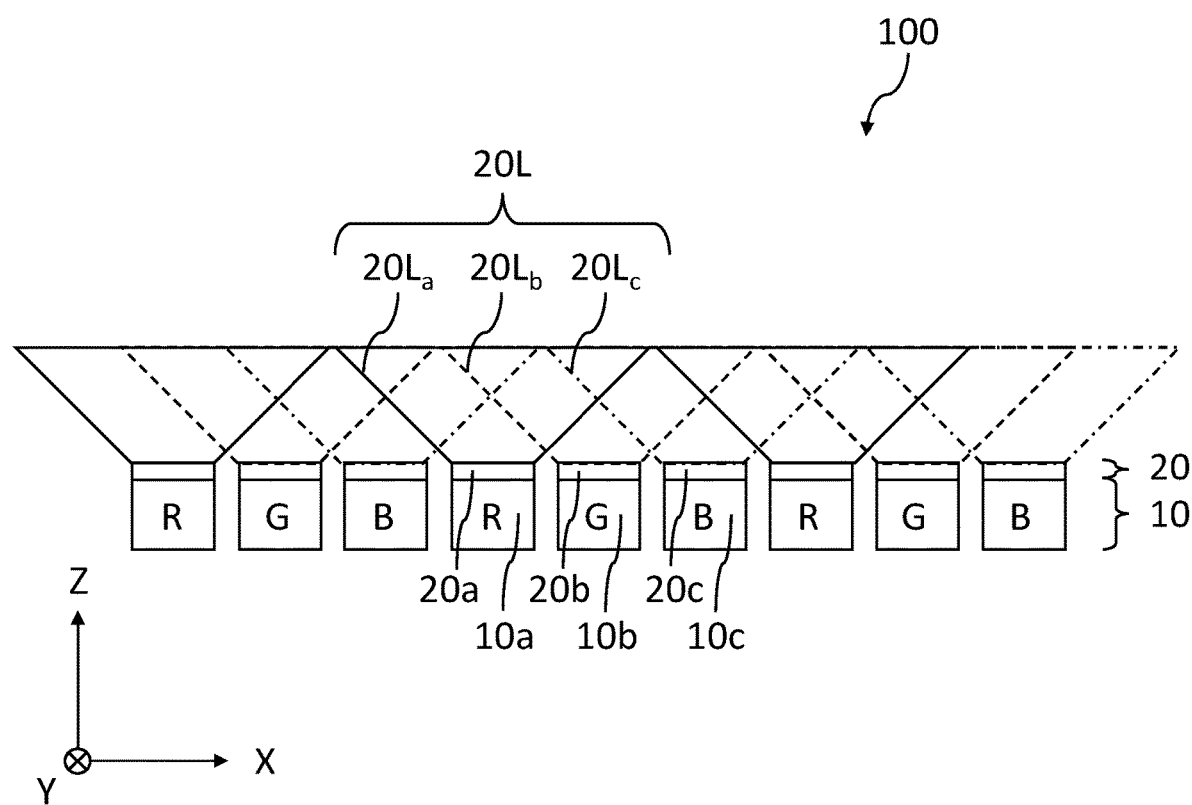
FIG. 1D is a schematic side view when a state where white polarized light is emitted from the light-emitting device according to the present embodiment is viewed from a Y direction.

FIG. 1D is a schematic side view when a state in which white light 20L is emitted from the light source device according to the present embodiment is viewed from the Y direction. For example, as illustrated in FIG. 1D, red light $20L_a$, green light $20L_b$, and blue light $20L_c$ are emitted in the Z direction from the first polarized light control member 20a, the second polarized light control member 20b, and the third polarized light control member 20c, respectively. Regions surrounded by a solid line, a broken line, and a dot-dash line illustrated in FIG. 1D represent the red light $20L_a$, the green light $20L_b$, and the blue light $20L_c$, respectively. Each light has a proportion of the second polarization component greater than a proportion of the first polarization component. The red light $20L_a$, the green light $20L_b$, and the blue light $20L_c$ spread in the X direction as they each travel in the Z direction. Accordingly, the white light 20L in which the red light $20L_a$, the green light $20L_b$, and the blue light $20L_c$ are mixed can be obtained above the polarized light control member 20. The light-emitting device 100 according to the present embodiment may be divided into a plurality of regions, and intensity of the white light 20L may be adjusted for each region to achieve local dimming.

The plurality of light-emitting elements 10 may include one type of a light-emitting element configured to emit light having a predetermined wavelength, or may include a plurality of types of light-emitting elements configured to emit light having predetermined wavelengths different from each other, depending on the application. The plurality of types of light-emitting elements are not limited to three types of light-emitting elements, and may be two types or four or more types of light-emitting elements. The light emitted from one type or a plurality of types of light-emitting elements does not need to be unpolarized light.

Specific Configuration Example of Light-Emitting Device

Figure 2A:
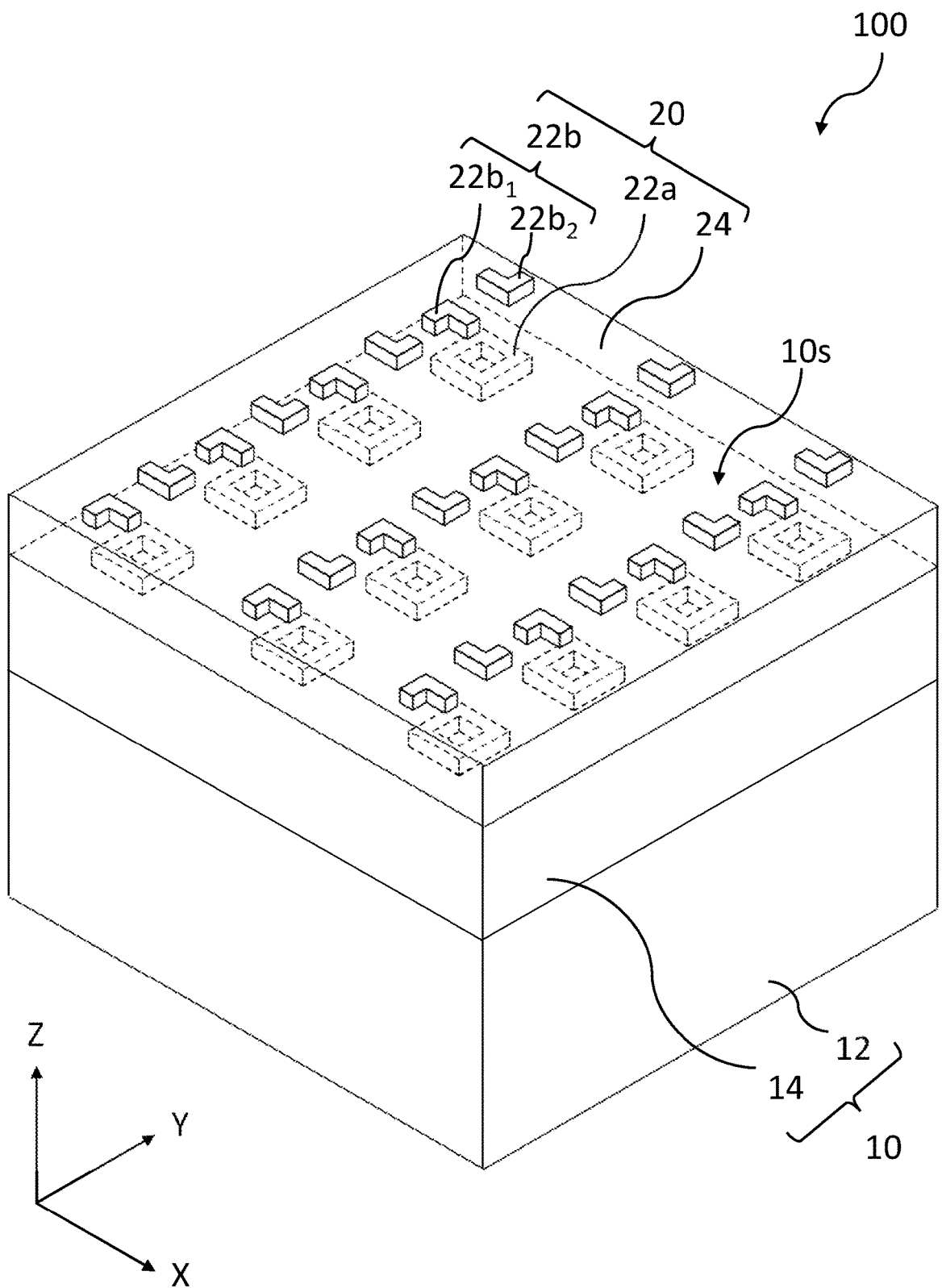
FIG. 2A is a schematic perspective view illustrating an example of the light-emitting element and the polarized light control member in the present embodiment.
Figure 2B:
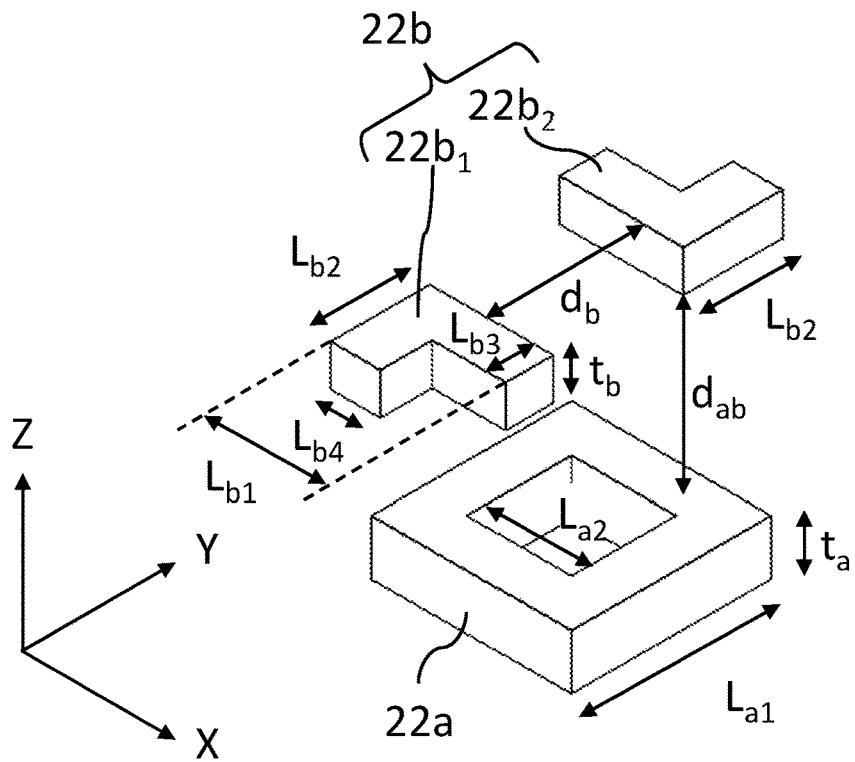
FIG. 2B is a schematic perspective view illustrating one set of a first structure and a second structure illustrated in FIG. 2A.
Figure 2C:
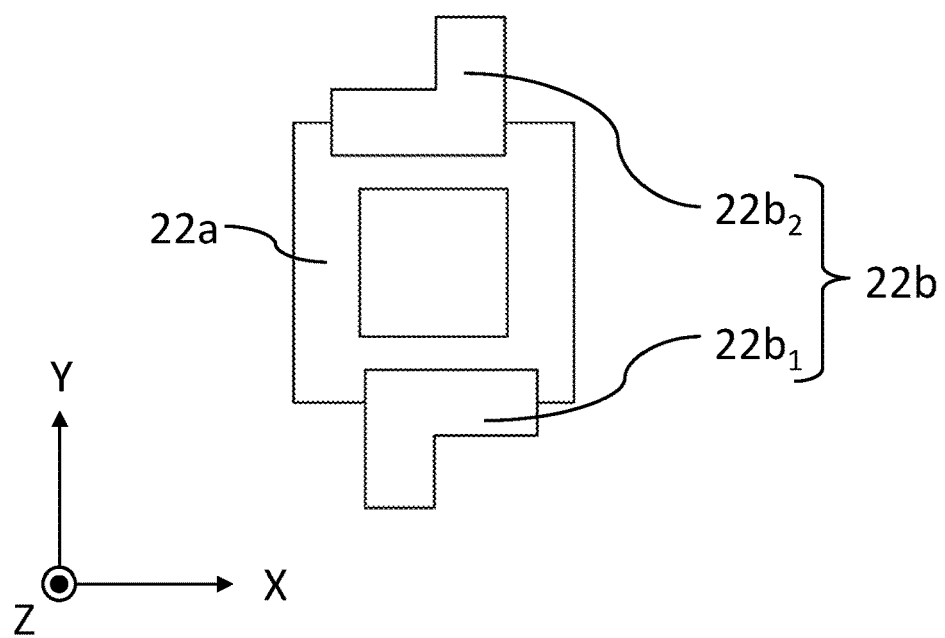
FIG. 2C is a schematic top view of the configuration illustrated in FIG. 2B.

With reference to FIGS. 2A to 2C, the light-emitting device according to one embodiment of the present disclosure will be described. FIG. 2A is a schematic perspective view illustrating an example of the light-emitting element 10 and the polarized light control member 20 in the present embodiment.

The light-emitting device 100 illustrated in FIG. 2A includes the light-emitting element 10 and the polarized light control member 20 in contact with the light-emitting element 10. The polarized light control member 20 includes a first structure 22a and a second structure 22b. The light-emitting element 10 is configured to emit light having a predetermined wavelength and including the first polarization component and the second polarization component. A portion of the emitted light passes around the first structure 22a (e.g., through a hollow portion of the first structure 22a) and the other portion of the emitted light is incident on the first structure 22a to generate near-field light. The light having passed around the first structure 22a and the near-field light generated by the first structure 22a act on the second structure 22b, and thus light having a proportion of one polarization component greater than a proportion of another polarization component with respect to the light emitted from the light-emitting element 10 is emitted from the second structure 22b. These members will be described below.

Light-Emitting Element 10

The light-emitting element 10 includes a semiconductor layered portion 12 and a light-transmissive member 14, and is configured to emit light having a predetermined wavelength and including the first polarization component and the second polarization component. As the light-emitting element 10, for example, a light-emitting element configured to emit ultraviolet light, purple light, blue light, green light, yellow light, red light, or infrared light can be appropriately selected and used depending on the application. For the light-emitting element 10, for example, a III-V group compound semiconductor and a silicon semiconductor can be used. As the III-V group compound semiconductor, for example, a nitride semiconductor, a GaAs-based semiconductor, and an InP-based semiconductor can be used. The light-emitting element 10 can include a substrate and a semiconductor layered portion provided on the substrate. The semiconductor layered portion can include an n-side semiconductor layer including an n-type semiconductor layer, an active layer, and a p-side semiconductor layer including a p-type semiconductor layer, that are located in this order. When the silicon semiconductor is used, a silicon substrate including n-type impurities, an n-type silicon semiconductor layer that is provided on the silicon substrate and includes n-type impurities, and a p-type silicon semiconductor layer including p-type impurities are located in this order. A pn junction is formed between the n-type semiconductor layer and the p-type semiconductor layer. The n-type impurity concentration of the silicon substrate is greater than the n-type impurity concentration of the n-type silicon semiconductor layer. Silicon can emit light by using dressed photons and dressed photon phonons by performing dressed photon phonon-assisted annealing. By appropriately selecting a wavelength of laser irradiation light when performing dressed photon phonon-assisted annealing, light having a wavelength corresponding to energy lower than energy of a band gap of silicon can be emitted. The wavelength is, for example, equal to or greater than 1300 nm.

Polarized Light Control Member 20

At least one polarized light control member 20 is in contact with the light-emitting element. With this structure, light from the light-emitting element can be efficiently converted into light having a proportion of the second polarization component greater than a proportion of the first polarization component.

The polarized light control member 20 can include a plurality of first structures 22a and a plurality of second structures 22b. The polarized light control member 20 can further include a dielectric layer 24 that covers lateral surfaces and upper surfaces of the plurality of first structures 22a. In this case, the second structure 22b is disposed on the dielectric layer 24. The first structure 22a and the second structure 22b are aligned in this order along the Z direction from the side of the light-emitting element 10. A single first structure 22a and a single second structure 22b can correspond to each other as a single set. With this structure, light from the light-emitting element can be efficiently converted into the first polarization component or the second polarization component. The first structure 22a and the second structure 22b may be formed of at least one metal selected from the group consisting of Au, Al, Ag, and Cu, for example.

In the example illustrated in FIG. 2A, array pitch in the X direction and array pitch in the Y direction of the plurality of sets of the first structure 22a and the second structure 22b can be appropriately set. The pitch of the first structure 22a and the second structure 22b can be set 530 nm or greater and 800 nm or less in the X direction and 320 nm or greater and 480 nm or less in the Y direction at a wavelength of 650 nm, for example. With this arrangement, absorption of light by the first structure 22a can be reduced, and efficiency of extracting a desired polarization component to the outside can be increased. The polarized light control member 20 includes twenty sets of the first structure 22a and the second structure 22b in the example illustrated in FIG. 2A, but may include other number of sets of the first structure 22a and the second structure 22b. The polarized light control member 20 can include an appropriate number of the sets such that absorption of light by the first structure 22a can be reduced and a desired polarization component can be extracted to the outside. The plurality of first structures 22a and the plurality of second structures 22b do not necessarily need to be periodically arrayed, and may be irregularly arranged.

Dielectric Layer 24

The dielectric layer 24 covers the lateral surface and the upper surface of the first structure 22a, and supports the second structure 22b by an upper surface of the dielectric layer 24. The dielectric layer 24 can maintain an arrangement relationship between the first structure 22a and the second structure 22b in the Z direction. Furthermore, the dielectric layer 24 is in contact with the light-emitting element 10, and holds the first structure 22a and the second structure 22b. A refractive index of the dielectric layer 24 can be lower than a refractive index of the light-emitting element 10. Energy of a band gap of the dielectric layer 24 can be greater than energy corresponding to a predetermined wavelength of light emitted from the light-emitting element 10. Therefore, absorption of the light emitted from the light-emitting element 10 in the dielectric layer 24 can be reduced. The dielectric layer 24 may be formed of, for example, $SiO_2$, resin, gallium nitride, aluminum nitride, or aluminum oxide.

First Structure 22a and Second Structure 22b FIG. 2B is a schematic perspective view illustrating a single set of the first structure 22a and the second structure 22b illustrated in FIG. 2A. FIG. 2C is a schematic top view of the configuration illustrated in FIG. 2B. In FIGS. 2B and 2C, illustrations of components other than the single set of the first structure 22a and the second structure 22b are omitted.

As illustrated in FIG. 2B, the first structure 22a has a hollow square shape in the XY plane, and has a thickness in the Z direction. With the hollow portion, the first structure 22a can efficiently transmit a part of incident light, so that a loss of the incident light including a desired polarization component due to absorption and/or reflection by the first structure 22a can be reduced. As illustrated in FIG. 2C, in the XY plane, the first structure 22a can have four-fold symmetry with respect to the center point of the hollow portion of the first structure 22a as a symmetrical point. As illustrated in FIG. 2B, the second structure 22b includes a first portion $22b_1$ and a second portion 22b2 located apart from each other along the Y direction in the XY plane. Each of the first portion $22b_1$ and the second portion 22b2 has a thickness in the Z direction. As illustrated in FIG. 2C, of the first portion $22b_1$ and the second portion 22b2, long protruding portions protrude in directions opposite to each other along the X direction, and short protruding portions protrude in directions opposite to each other along the Y direction. As illustrated in FIG. 2C, in the XY plane, the second structure 22b can have two-fold symmetry with respect to the center point of the hollow portion of the first structure 22a, as a symmetrical point. As illustrated in FIG. 2C, the first structure 22a and the second structure 22b can have portions overlapping each other when viewed from the Z direction, i.e., in a top plan view. Specifically, a part of each of the first portion $22b_1$ and the second portion $22b_2$ that are included in the second structure 22b overlaps a part of the first structure 22a in the top plan view.

In each of the first structure 22a and the second structure 22b, a length in the height direction perpendicular to the light-emitting surface 10s of the light-emitting element 10, a length in the vertical direction perpendicular to the height direction, and a length in the horizontal direction perpendicular to both of the height direction and the vertical direction are less than a predetermined wavelength. A distance between the first structure 22a and the second structure 22b is less than the predetermined wavelength. A ratio of a length of the second structure 22b in the horizontal direction to a length of the second structure 22b in the vertical direction is greater than 1. In other words, all of maximum lengths of each of the first structure 22a and the second structure 22b in the X direction, the Y direction, and the Z direction that are included in the polarized light control member 20 are less than the predetermined wavelength of the light emitted from the light-emitting element 10 corresponding to the polarized light control member 20. Further, a length of a gap in the Z direction between the first structure 22a and the second structure 22b that are included in the polarized light control member 20 is less than the predetermined wavelength of the light emitted from the light-emitting element 10 corresponding to the polarized light control member 20. In this specification, a length of a gap between two objects may be referred to as an "arrangement interval." A ratio of the maximum length of the second structure 22b in the Y direction to the maximum length of the second structure 22b in the X direction is greater than 1. With this configuration, the second structure 22b can receive near-field light generated by the first structure 22a to emit light having a desired polarization component. In the example illustrated in FIG. 2B, the maximum length of the second structure 22b h in the Y direction is a total of a length $L_{b2}$ of the first portion $22b_1$, in the Y direction, a length $L_{b2}$ of the second portion 22b2 in the Y direction, and an arrangement interval $d_b$ therebetween.

Principle

Emission of light from a single set of the first structure 22a and the second structure 22b when receiving incident light will be briefly described below.

The first structure 22a receives a part of incident light having a predetermined wavelength and including the first polarization component and the second polarization component to generate near-field light.

Further, the second structure 22b receives incident light with which the second structure 22b is irradiated without being applied to the first structure 22a, incident light passing around and/or scattered in the first structure 22a, and near-field light. These incident lights may be collectively referred to as "propagation light" below.

First light is emitted from the second structure 22b, based on an electric field caused by dielectric polarization generated by the second structure 22b receiving propagation light. The first light includes light that generates a phase delay according to an interval between the first structure 22a and the second structure 22b. Similarly, second light is emitted from the second structure 22b, due to dielectric polarization generated by the second structure 22b receiving near-field light. The second light is caused by the near-field light, and does not thus generate a phase delay like the first light. On the other hand, a proportion of the first polarization component and the second polarization component that are included in the second light varies according to a shape and a length of the first portion $22b_1$ and the second portion $22b_2$ that are included in the second structure 22b. The first polarization component and the second polarization component are defined as a polarization component in a light-emitting surface direction. For example, the first polarization component is X-polarized light, and the second polarization component is Y-polarized light. Transmitted light on which the first light and the second light are superimposed is emitted in the Z direction from the second structure 22b. As illustrated in FIG. 2C, a length in the Y direction of the first portion $22b_1$ and the second portion $22b_2$ that are included in the second structure 22b is set less than a length in the X direction, which allows for increasing a proportion of the second polarization component in the near-field light. Accordingly, a proportion of the second polarization component in the transmitted light on which the first light and the second light are superimposed can be set greater than a proportion of the first polarization component.

Arrangement Relationship Between First Structure 22a and Second Structure 22b

As described above, the second structure 22b receives the near-field light generated by the first structure 22a and the propagation light passing through the first structure 22a. Therefore, an arrangement interval in the Z direction between the first structure 22a and the second structure 22b is designed to be a distance that allows the near-field light generated in the first structure 22a to interact with the second structure 22b. Such a distance may be equal to or less than a wavelength of the incident light, for example. For example, when the incident light is red light, the arrangement interval is equal to or less than 750 nm. When the incident light is green light, the arrangement interval is less than 575 nm. When the incident light is blue light, the arrangement interval is less than 495 nm. When an arrangement interval between the first structure 22a and the second structure 22b is deviated by ±50 nm with respect to a predetermined interval, a transmittance of the second polarization component may be reduced by approximately 3%, for example. Also, in this case, a wavelength at which a transmittance of the second polarization component is the highest may be different by approximately ±5 nm, for example. The near-field light generated by the first structure 22a efficiently interacts with a portion overlapping the first structure 22a in the top plan view of each of the first portion $22b_1$ and the second portion $22b_2$ that are included in the second structure 22b. This is due to that the second structure 22b can receive the near-field light generated by the first structure 22a with a shorter distance between the first structure 22a and the second structure 22b.

Modified Example

Next, with reference to FIGS. 3A and 3B, a modified example of the polarized light control member 20 will be described. Only difference from the embodiment described above will be described below.

Figure 3A:
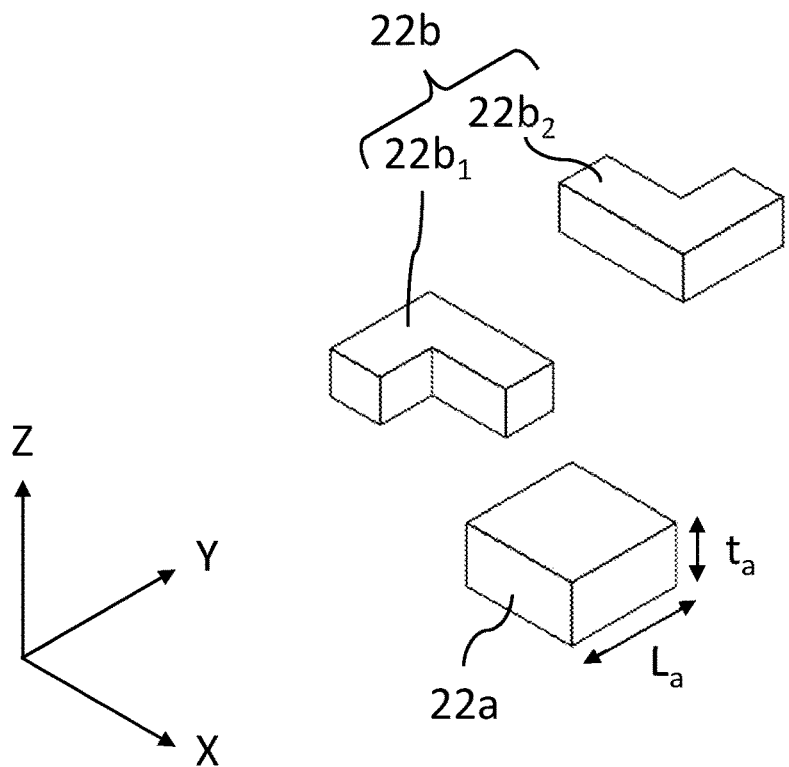
FIG. 3A is a schematic perspective view illustrating one set of the first structure and the second structure.

FIG. 3A is a schematic perspective view illustrating a single set of the first structure 22a and the second structure 22b. FIG. 3B is a schematic top view of the configuration illustrated in FIG. 3A. In FIGS. 3A and 3B, illustrations of components other than the single set of the first structure 22a and the second structure 22b are omitted. As illustrated in FIGS. 3A and 3B, the first structure 22a has a rectangular parallelepiped shape, and does not have a hollow structure. Further, as illustrated in FIG. 3B, the first structure 22a and the second structure 22b do not overlap each other in the top view. Also, in such a configuration, a distance between the first structure 22a and the second structure 22b is set less than the predetermined wavelength of the light emitted from the light-emitting element, which allows the near-field light generated by the first structure 22a to interact with the second structure 22b. The first structure 22a does not have a through-hole, which allows for facilitating manufacturing of the first structure 22a.

A shape of each of the first structure 22a and the second structure 22b is not limited to the example described above. The first structure 22a may have a circular plate shape or a spherical shape, for example. The first structure 22a does not necessarily have four-fold symmetry. The second structure 22b does not need to have a plurality of portions located apart from each other, and may be a single structure. The second structure 22b does not necessarily have two-fold symmetry.

Specific Configuration Example of Light-Emitting Device

Next, with reference to FIGS. 4A to 4D, specific configuration examples 1 to 4 of the light-emitting device 100 according to the present embodiment will be described.

Configuration Example 1 of Light-Emitting Device

Figure 4A:
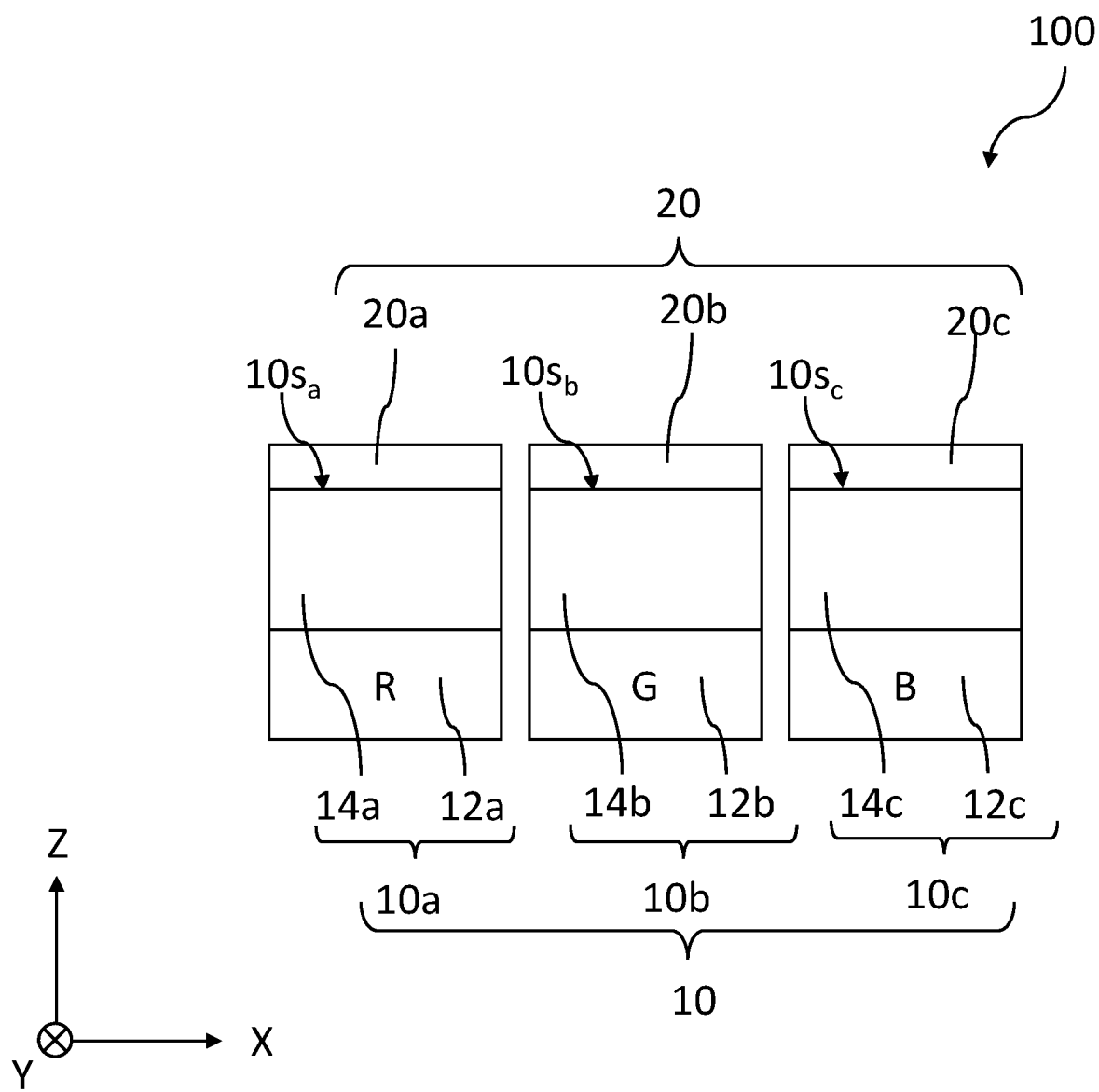
FIG. 4A is a schematic side view illustrating a configuration example 1 of the light-emitting device in the present embodiment when viewed from the Y direction.

FIG. 4A is a schematic side view illustrating the configuration example 1 of the plurality of light-emitting devices 100 in the present embodiment when viewed from the Y direction. The light-emitting device 100 includes the plurality of light-emitting elements 10 and the plurality of polarized light control members 20. The plurality of light-emitting elements 10 include the first light-emitting element 10a configured to emit light having a first wavelength as a predetermined wavelength, the second light-emitting element 10b configured to emit light having a second wavelength as a predetermined wavelength, and the third light-emitting element 10c configured to emit light having a third wavelength as a predetermined wavelength. The first wavelength, the second wavelength, and the third wavelength are different from one another. The plurality of polarized light control members 20 include the first polarized light control member 20a, the second polarized light control member 20b, and the third polarized light control member 20c. The first light-emitting element 10a includes a first semiconductor layered portion 12a (indicated as "R" in FIG. 4A) configured to emit unpolarized red light having the first wavelength, and a first light-transmissive member 14a disposed on the first semiconductor layered portion 12a. The second light-emitting element 10b includes a second semiconductor layered portion 12b (indicated as "G" in FIG. 4A) configured to emit unpolarized green light having the second wavelength, and a second light-transmissive member 14b disposed on the second semiconductor layered portion 12b. The third light-emitting element 10c includes a third semiconductor layered portion 12c (indicated as "B" in FIG. 4A) configured to emit unpolarized blue light having the third wavelength, and a third light-transmissive member 14c provided on the third semiconductor layered portion 12c.

Upper surfaces of the first light-transmissive member 14a, the second light-transmissive member 14b, and the third light-transmissive member 14c are a first light-emitting surface $10s_a$, a second light-emitting surface $10s_b$, and a third light-emitting surface $10s_c$, respectively. The first light-emitting element 10a to the third light-emitting element 10c are a so-called flip-chip LED. In this specification, these light-emitting elements are also referred to as "semiconductor light-emitting elements."

An n-type semiconductor layer, an active layer, and a p-type semiconductor layer are layered in this order from an upper side in each of the first semiconductor layered portion 12a to the third semiconductor layered portion 12c. The relationship between the conductivity types may be reversed. A first electrode electrically connected to the p-type semiconductor layer and a second electrode electrically connected to the n-type semiconductor layer are disposed on a lower surface of each of the first semiconductor layered portion 12a to the third semiconductor layered portion 12c. By applying a voltage to the first electrode and the second electrode, light is emitted from the active layer.

For the first light-emitting element 10a, the second light-emitting element 10b, and the third light-emitting element 10c, the first semiconductor layered portion 12a, the second semiconductor layered portion 12b, and the third semiconductor layered portion 12c may be formed of, for example, GaN-based, InGaN-based, and AlGaN-based semiconductor materials, and the first light-transmissive member 14a, the second light-transmissive member 14b, and the third light-transmissive member 14c may be formed of, for example, sapphire. In the example illustrated in FIG. 4A, the first semiconductor layered portion 12a to the third semiconductor layered portion 12c have the same thickness, but may have different thicknesses. Similarly, the first light-transmissive member 14a to the third light-transmissive member 14c have the same thickness, but may have different thicknesses. Each of the first light-transmissive member 14a to the third light-transmissive member 14c may include a plurality of portions formed of different light-transmissive materials.

The first light-transmissive member 14a is located between the first semiconductor layered portion 12a and the first polarized light control member 20a. The upper surface of the first light-transmissive member 14a is in contact with a lower surface of the first polarized light control member 20a. Similarly, the second light-transmissive member 14b is located between the second semiconductor layered portion 12b and the second polarized light control member 20b. The upper surface of the second light-transmissive member 14b is in contact with a lower surface of the second polarized light control member 20b. Similarly, the third light-transmissive member 14c is located between the third semiconductor layered portion 12c and the third polarized light control member 20c. The upper surface of the third light-transmissive member 14c is in contact with a lower surface of the third polarized light control member 20c.

A refractive index of the first light-transmissive member 14a can be set higher than a refractive index of the first semiconductor layered portion 12a and lower than a refractive index of the first polarized light control member 20a. Therefore, the refractive index is an intermediate value therebetween. Thus, even when a part of light emitted from the first semiconductor layered portion 12a is incident on an interface between the first semiconductor layered portion 12a and the first light-transmissive member 14a and an interface between the first light-transmissive member 14a and the first polarized light control member 20a in a slanting direction, a proportion of total reflection of the part of the light can be reduced, so that efficiency of extracting light from the first light-emitting element 10a can be improved. The same also applies to a relationship of a refractive index among the second semiconductor layered portion 12b, the second light-transmissive member 14b, and the second polarized light control member 20b. The same also applies to a relationship of a refractive index among the third semiconductor layered portion 12c, the third light-transmissive member 14c, and the third polarized light control member 20c.

As illustrated in FIG. 4A, the light emitted from the first semiconductor layered portion 12a passes through the first light-transmissive member 14a and the first polarized light control member 20a, and the light having a proportion of the second polarization component greater than a proportion of the first polarization component can be emitted. The same also applies to the light emitted from the other semiconductor layered portions.

At least one of a shape, a size, and an arrangement interval of the first structure and the second structure that are included in the first polarized light control member, the second polarized light control member, and the third polarized light control member varies according to a wavelength of light applied to each of the polarized light control members. With this configuration, each of the polarized light control members receives unpolarized light having a predetermined wavelength being emitted from a corresponding semiconductor layered portion, and efficiently converts a part of the first polarization component into the second polarization component. Accordingly, each of the light-emitting devices 100 can emit light having a proportion of the second polarization component greater than a proportion of the first polarization component.

As illustrated in FIG. 4A, with a gap between adjacent ones of the first light-emitting element 10a to the third light-emitting element 10c, light that is emitted from each semiconductor layered portion, satisfies a condition of total reflection, and is incident on a lateral surface of each light-transmissive member, reflected at the lateral surface, and emitted from an upper surface of each light-transmissive member. Accordingly, the efficiency of extraction of light from each of the light-emitting elements can be improved.

Configuration Example 2 of Light-Emitting Device

Figure 4B:
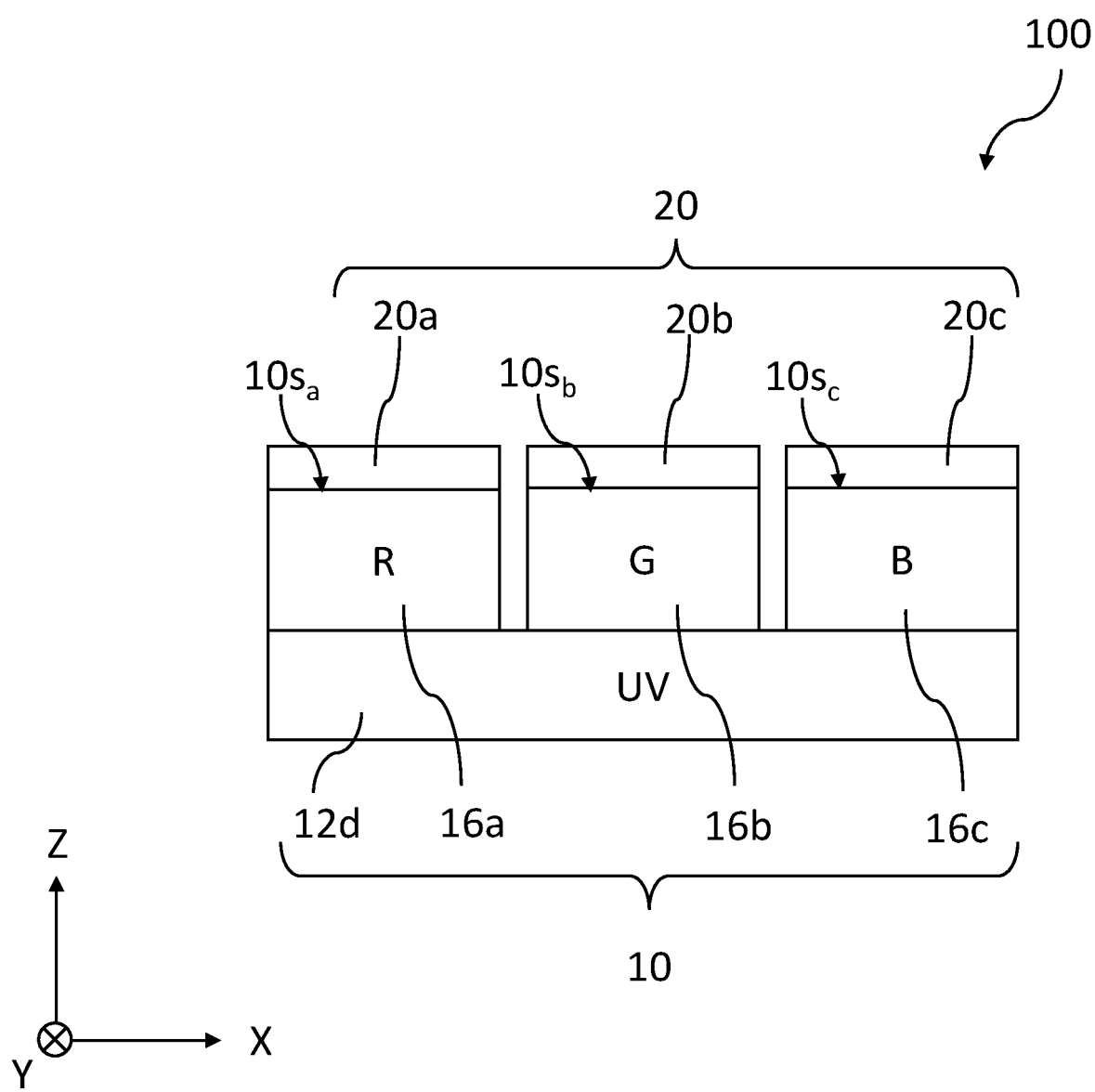
FIG. 4B is a schematic side view illustrating a configuration example 2 of the light-emitting device in the present embodiment when viewed from the Y direction.

FIG. 4B is a schematic side view illustrating the configuration example 2 of the light-emitting device 100 in the present embodiment when viewed from the Y direction. The light-emitting device 100 includes at least one light-emitting element 10 and the plurality of polarized light control members 20. The light-emitting element 10 includes a fourth semiconductor layered portion 12d (indicated as "UV" in FIG. 4B) configured to emit purple light or ultraviolet light, a first wavelength conversion member 16a (indicated as "R" in FIG. 4B) disposed on a first region of an upper surface of the fourth semiconductor layered portion 12d, a second wavelength conversion member 16b (indicated as "G" in FIG. 4B) disposed on a second region of the upper surface of the fourth semiconductor layered portion 12d, and a third wavelength conversion member 16c (indicated as "B" in FIG. 4B) disposed on a third region of the upper surface of the fourth semiconductor layered portion 12d. The plurality of polarized light control members 20 include the first polarized light control member 20a, the second polarized light control member 20b, and the third polarized light control member 20c. The fourth semiconductor layered portion 12d is similar to the configuration example 1 except that an active layer has a quantum well structure including a barrier layer formed of AlN or AlGaN and a well layer formed of AlGaN or GaN. For example, purple light or ultraviolet light is emitted from the active layer. The first wavelength conversion member 16a, the second wavelength conversion member 16b, and the third wavelength conversion member 16c are irradiated with purple light or ultraviolet light emitted from the common fourth semiconductor layered portion 12d. The first wavelength conversion member 16a emits unpolarized red light having a first wavelength when purple light or ultraviolet light is incident thereon. The second wavelength conversion member 16b emits unpolarized green light having a second wavelength when purple light or ultraviolet light is incident thereon. The third wavelength conversion member 16c emits unpolarized blue light having a third wavelength when purple light or ultraviolet light is incident thereon. An upper surface of the first wavelength conversion member 16a, an upper surface of the second wavelength conversion member 16b, and an upper surface of the third wavelength conversion member 16c are a first light-emitting surface $10s_a$, a second light-emitting surface $10s_b$, and a third light-emitting surface $10s_c$, respectively.

Each of the first wavelength conversion member 16a to the third wavelength conversion member 16c is formed of a phosphor and a binder, or a sintered body of a phosphor. The binder may be an inorganic material such as resin, aluminum oxide, and aluminum nitride, for example. The first wavelength conversion member 16a may contain a phosphor formed of a phosphor (also referred to as a "KSF phosphor" below) having a composition represented by $K_2SiF_6$:Mn, for example. The second wavelength conversion member 16b may contain a phosphor having a composition represented by $Si_{6-z}Al_zO_zN_{8-z}$:Eu (0<z≤4.2) (also referred to as a "β sialon phosphor") or a phosphor formed of AlN ceramics in which Eu is activated, for example. The third wavelength conversion member 16c may contain a phosphor formed of $Ca_{10}(PO_4)_6Cl_2$:Eu (also referred to as a CCA phosphor), for example. In the example illustrated in FIG. 4B, the first wavelength conversion member 16a to the third wavelength conversion member 16c have the same thickness, but may have different thicknesses.

The first wavelength conversion member 16a is located between the fourth semiconductor layered portion 12d and the first polarized light control member 20a. The upper surface of the first wavelength conversion member 16a is in contact with a lower surface of the first polarized light control member 20a. Similarly, the second wavelength conversion member 16b is located between the fourth semiconductor layered portion 12d and the second polarized light control member 20b. The upper surface of the second wavelength conversion member 16b is in contact with a lower surface of the second polarized light control member 20b. Similarly, the third wavelength conversion member 16c is located between the fourth semiconductor layered portion 12d and the third polarized light control member 20c. The upper surface of the third wavelength conversion member 16c is in contact with a lower surface of the third polarized light control member 20c.

An interval between adjacent ones of the first wavelength conversion member 16a to the third wavelength conversion member 16c, and an interval between adjacent ones of the first polarized light control member 20a to the third polarized light control member 20c may be created as follows. The first wavelength conversion member 16a to the third wavelength conversion member 16c are formed without a gap on the fourth semiconductor layered portion 12d, and the first polarized light control member 20a to the third polarized light control member 20c are formed without a gap on the first wavelength conversion member 16a to the third wavelength conversion member 16c, respectively. Then, an interval is created by forming a groove.

At least one of a shape, a size, and an arrangement interval of the first structure and the second structure that are included in the first polarized light control member, the second polarized light control member, and the third polarized light control member varies according to a wavelength of light applied to each of the polarized light control members. With this configuration, each of the polarized light control members receives unpolarized light emitted from a corresponding wavelength conversion member, and efficiently converts a part of the first polarization component into the second polarization component. Accordingly, the light-emitting device 100 can emit light having a proportion of the second polarization component greater than a proportion of the first polarization component.

Configuration Example 3 of Light-Emitting Device

Figure 4C:
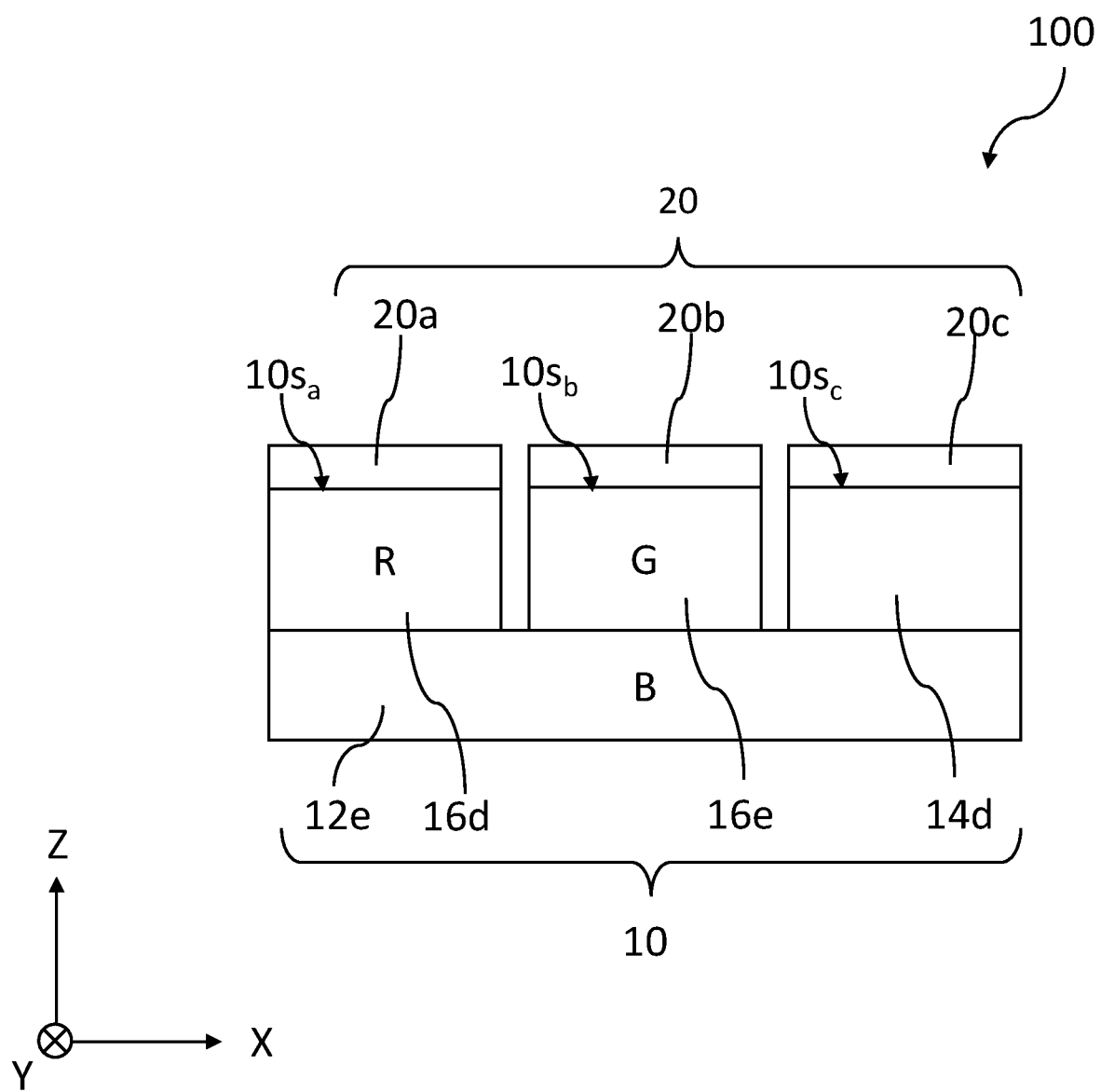
FIG. 4C is a schematic side view illustrating a configuration example 3 of the light-emitting device in the present embodiment when viewed from the Y direction.

FIG. 4C is a schematic side view illustrating the configuration example 3 of the light-emitting device 100 in the present embodiment when viewed from the Y direction. The light-emitting device 100 includes at least one light-emitting element 10 and the plurality of polarized light control members 20. The light-emitting element 10 includes a fifth semiconductor layered portion 12e (indicated as "B" in FIG. 4C) configured to emit unpolarized blue light, a fourth wavelength conversion member 16d (indicated as "R" in FIG. 4C) disposed on a first region of an upper surface of the fifth semiconductor layered portion 12d, a fifth wavelength conversion member 16e (indicated as "G" in FIG. 4C) disposed on a second region of the upper surface of the fifth semiconductor layered portion 12e, and a fourth light-transmissive member 14d disposed on a third region of the upper surface of the fifth semiconductor layered portion 12e. The plurality of polarized light control members 20 include the first polarized light control member 20a, the second polarized light control member 20b, and the third polarized light control member 20c. The first polarized light control member 20a is in contact with the fourth wavelength conversion member 16d. The second polarized light control member 20b is in contact with the fifth wavelength conversion member 16e. The third polarized light control member 20c is in contact with the fourth light-transmissive member 14d. The fifth semiconductor layered portion 12e is similar to the configuration example 1 except that an active layer has a quantum well structure including a barrier layer formed of AlN, AlGaN, or GaN and a well layer formed of GaN or InGaN. For example, blue light is emitted from the active layer. The fourth wavelength conversion member 16d, the fifth wavelength conversion member 16e, and the fourth light-transmissive member 14d are irradiated with unpolarized blue light emitted from the common fifth semiconductor layered portion 12e. When blue light is incident, the fourth wavelength conversion member 16d emits unpolarized red light having a first wavelength, and the fifth wavelength conversion member 16e emits unpolarized green light having a second wavelength. The fourth light-transmissive member 14d transmits unpolarized blue light having a third wavelength. An upper surface of the fourth wavelength conversion member 16d and an upper surface of the fifth wavelength conversion member 16e are a first light-emitting surface $10s_a$ and a second light-emitting surface $10s_b$, respectively. An upper surface of the fourth light-transmissive member 14d is a third light-emitting surface 10s$_c$. With the fourth light-transmissive member 14d, the height of the third polarized light control member 20c, the height of the first polarized light control member 20a and the height of the second polarized light control member 20b can be aligned. This allows for facilitating disposition of the polarized light control member 20 on the light-emitting element 10.

The fourth wavelength conversion member 16d may contain a phosphor formed of a KSF phosphor, and a resin, for example. The fifth wavelength conversion member 16e may contain a phosphor formed of a β sialon phosphor, and a resin, for example. The fourth light-transmissive member 14d may be formed of sapphire, $SiO_2$, or a resin, for example.

Similarly to the configuration example 3 described above, each of the light-emitting devices 100 can emit light having a proportion of the second polarization component greater than a proportion of the first polarization component.

Configuration Example 4 of Light-Emitting Device

Figure 4D:
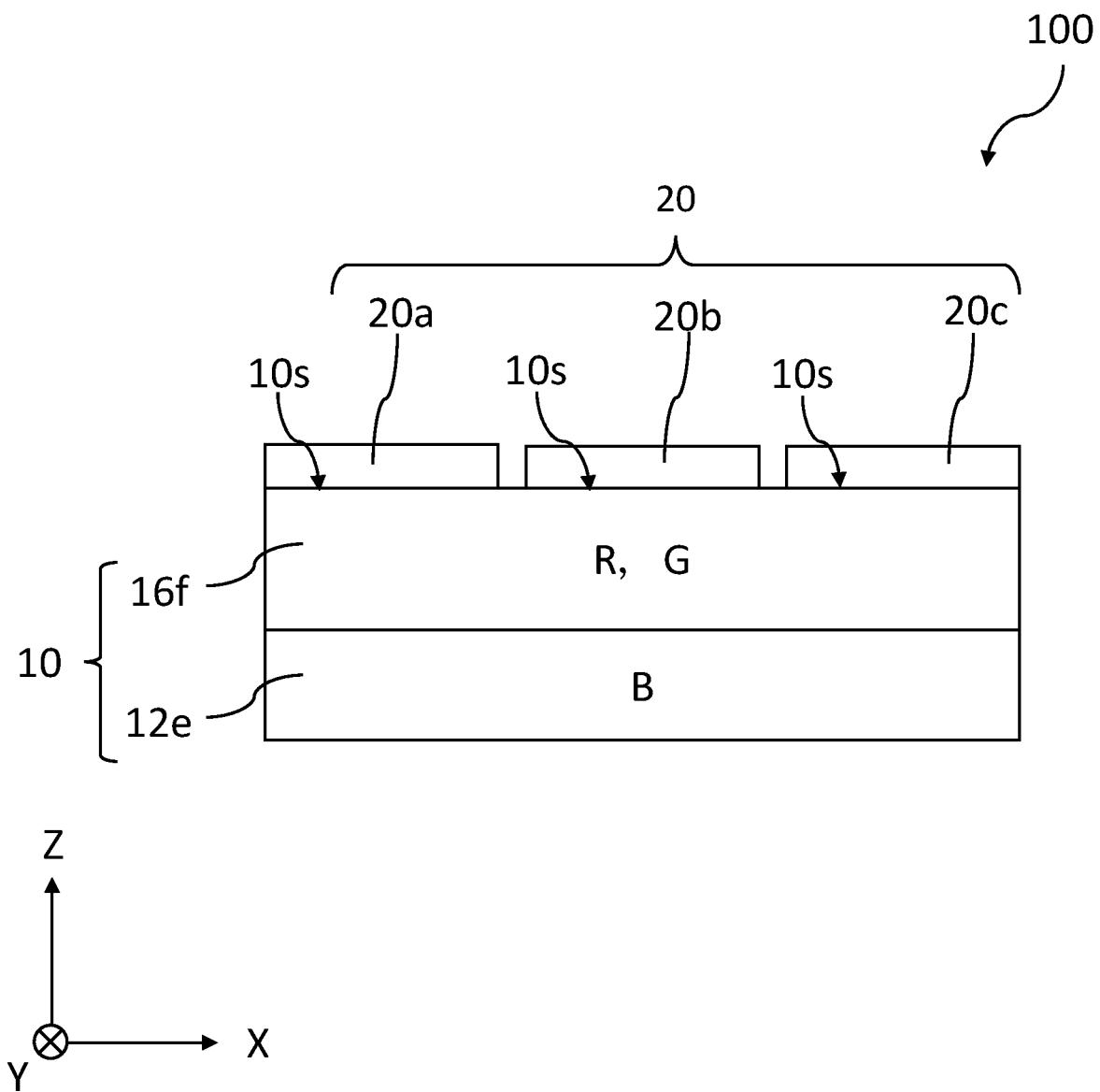
FIG. 4D is a schematic side view illustrating a configuration example 4 of the light-emitting device in the present embodiment when viewed from the Y direction.

FIG. 4D is a schematic side view illustrating the configuration example 4 of the light-emitting device 100 in the present embodiment when viewed from the Y direction. The light-emitting device 100 includes at least one light-emitting element 10 and the plurality of polarized light control members 20. The light-emitting element 10 includes a common fifth semiconductor layered portion 12e (indicated as "B" in FIG. 4D) configured to emit unpolarized blue light, and a common sixth wavelength conversion member 16f (indicated as "R, G" in FIG. 4D) provided on the common fifth semiconductor layered portion 12e. The plurality of polarized light control members 20 include the first polarized light control member 20a, the second polarized light control member 20b, and the third polarized light control member 20c. The sixth wavelength conversion member 16f includes at least a first phosphor that emits red light having a first wavelength when blue light is incident thereon, and a second phosphor that emits green light having a second wavelength when blue light is incident thereon. The sixth wavelength conversion member 16f transmits unpolarized blue light having a third wavelength that has not been subjected to wavelength-conversion by the first and second phosphors. The first phosphor may be, for example, a KSF phosphor, and the second phosphor may be, for example, a β-sialon phosphor. The sixth wavelength conversion member 16f may further include a third phosphor that emits unpolarized yellow light when blue light is incident thereon. The sixth wavelength conversion member 16f may contain, for example, an yttrium aluminum garnet (YAG)-based phosphor. The YAG-based phosphor can be $(Y, Gd)_3(Al, Ga)_5O_{12}$:Ce. An upper surface of the sixth wavelength conversion member 16f includes the light-emitting surface 10s. The light-emitting element 10 emits each of unpolarized blue light, unpolarized red light, and unpolarized green light from the light-emitting surface 10s.

The sixth wavelength conversion member 16f is located between the first polarized light control member 20a, the second polarized light control member 20b, and the third polarized light control member 20c, and the fifth semiconductor layered portion 12e. The upper surface of the sixth wavelength conversion member 16f is in contact with a lower surface of each of the first polarized light control member 20a to the third polarized light control member 20c.

At least one of a shape, a size, and an arrangement interval of the first structure and the second structure that are included in the first polarized light control member 20a is determined such that the first polarized light control member 20a can be made to efficiently cause, for red light, a proportion of the second polarization component higher than a proportion of the first polarization component. At least one of a shape, a size, and an arrangement interval of the first structure and the second structure that are included in the second polarized light control member 20b is determined such that the second polarized light control member 20b can be made to efficiently cause, for green light, a proportion of the second polarization component higher than a proportion of the first polarization component. At least one of a shape, a size, and an arrangement interval of the first structure and the second structure that are included in the third polarized light control member 20c is determined such that the third polarized light control member 20c can be made to efficiently cause, for blue light, a proportion of the second polarization component higher than a proportion of the first polarization component.

Configuration Example of Display

Figure 5A:
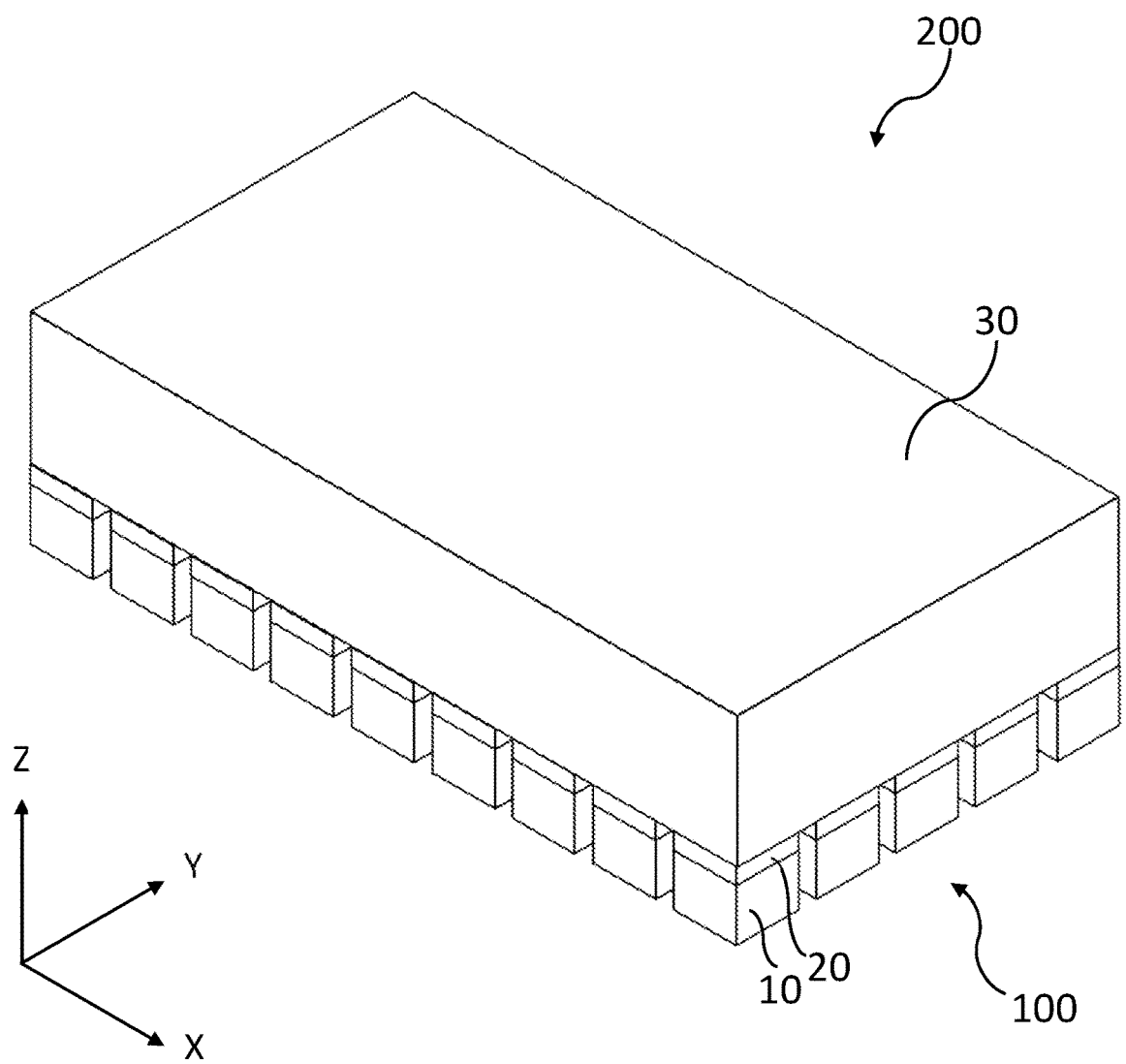
FIG. 5A is a schematic perspective view illustrating a configuration example of a display according to the present embodiment.
Figure 5B:
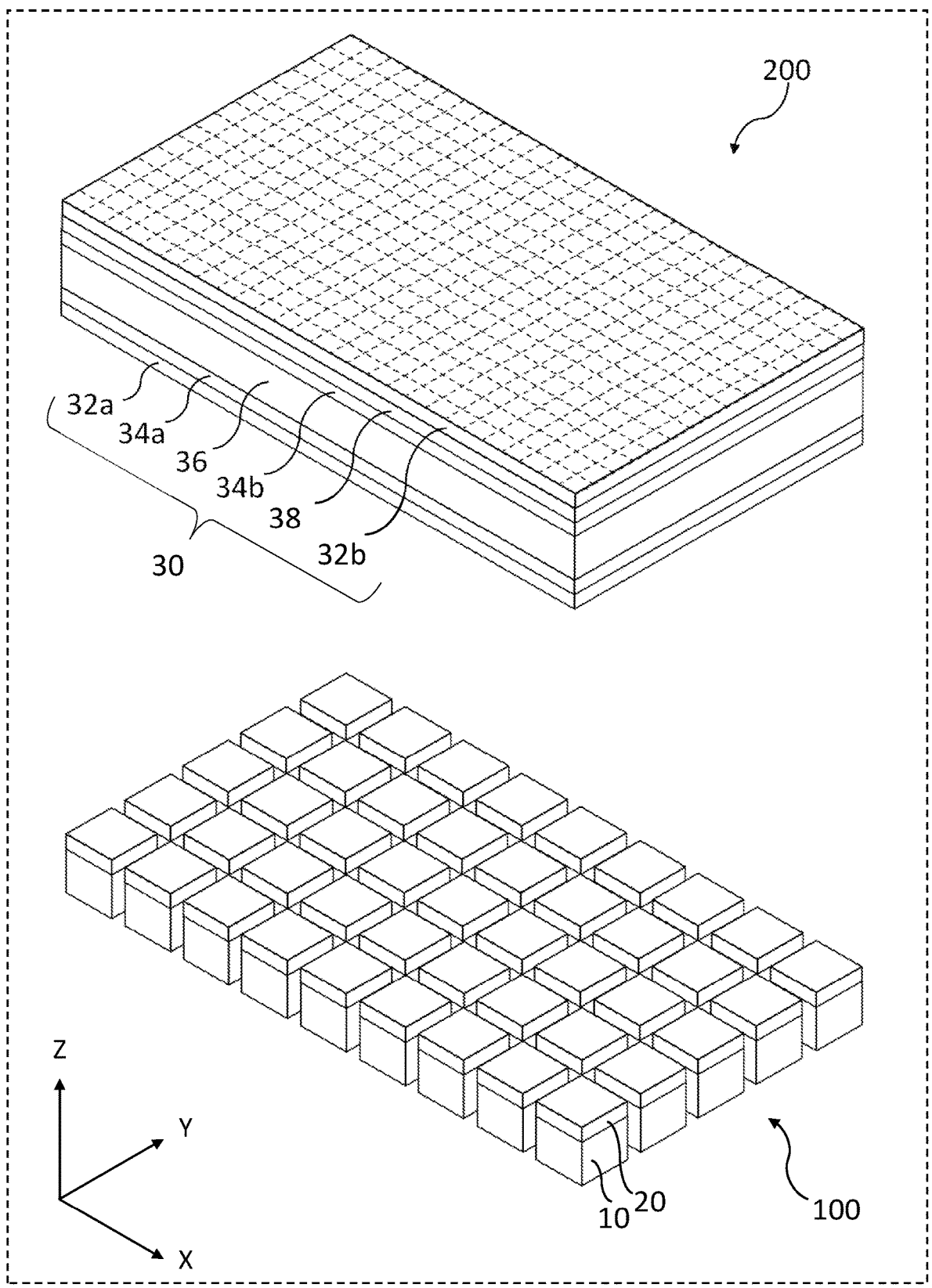
FIG. 5B is an exploded perspective view of the display illustrated in FIG. 5A.

Next, with reference to FIGS. 5A and 5B, a configuration example of a display according to the present embodiment will be described. FIG. 5A is a schematic perspective view illustrating the configuration example of the display according to the present embodiment. A display 200 illustrated in FIG. 5A includes the plurality of light-emitting devices 100, and a liquid crystal panel 30 provided on the plurality of light-emitting devices 100. There may be an interval or another component between the plurality of light-emitting devices 100 and the liquid crystal panel 30. FIG. 5B is an exploded perspective view of the display illustrated in FIG. 5A.

As illustrated in FIG. 5B, the liquid crystal panel 30 in the present embodiment includes a first polarizing plate 32a, a first light-transmitting electrode 34a, a liquid crystal layer 36, a second light-transmitting electrode 34b, a color filter 38, and a second polarizing plate 32b located in this order from the side of the plurality of light-emitting devices 100. The liquid crystal panel 30 may include a component other than these components. A plurality of regions demarcated by vertical and horizontal broken lines illustrated in FIG. 5B represent a plurality of pixels. A pixel pitch may be 1 μm or greater and 1 mm or less, for example. The first polarizing plate 32a transmits light polarized in the Y direction (i.e., a direction parallel to the second polarization component), and the second polarizing plate 32b transmits light polarized in the X direction (i.e., a direction parallel to the first polarization component). By applying a voltage to the first light-transmitting electrode 34a and the second light-transmitting electrode 34b, an orientation direction of a liquid crystal material included in the liquid crystal layer 36 is controlled. Such an orientation control is performed for each pixel. The color filter 38 includes red, green, and blue filters for each pixel. Each of the polarized light control members 20 is wider than a single pixel in the XY plane. In the example illustrated in FIG. 5B, each of the polarized light control members 20 substantially overlaps pixels arrayed in three rows and three columns in the top view. The rows and columns are parallel to the X and Y directions, respectively.

A lower surface of the liquid crystal panel 30 is irradiated with white light emitted from the plurality of light-emitting devices 100. The white light has a proportion of the second polarization component greater than a proportion of the first polarization component. The white light is incident on the first polarizing plate 32a included in the liquid crystal panel 30. The first polarizing plate 32a transmits light polarized in the Y direction and absorbs light polarized in the X direction, in the white light. A part of the light polarized in the Y direction passing through the first polarizing plate 32a may be converted into the light polarized in the X direction via the liquid crystal layer 36 and be transmitted through the second polarizing plate 32b. By switching on and off of voltage application for each pixel, transmission and blocking of light can be controlled for each pixel.

As illustrated in FIG. 5A, the light-emitting device 100 according to the present embodiment can be used for a so-called direct backlight. In this case, in comparison with a so-called edge backlight, in the plurality of light-emitting devices 100, light having a proportion of the second polarization component greater than a proportion of the first polarization component can be effectively introduced into liquid crystals and be transmitted. Further, by using the light-emitting device 100 for a direct backlight, lighting control such as local dimming can be performed in a higher definition manner, which is advantageous for high-definition display and the like of the display, in comparison with an edge backlight.

Configuration Example of Virtual Image Display Device

Figure 5C:
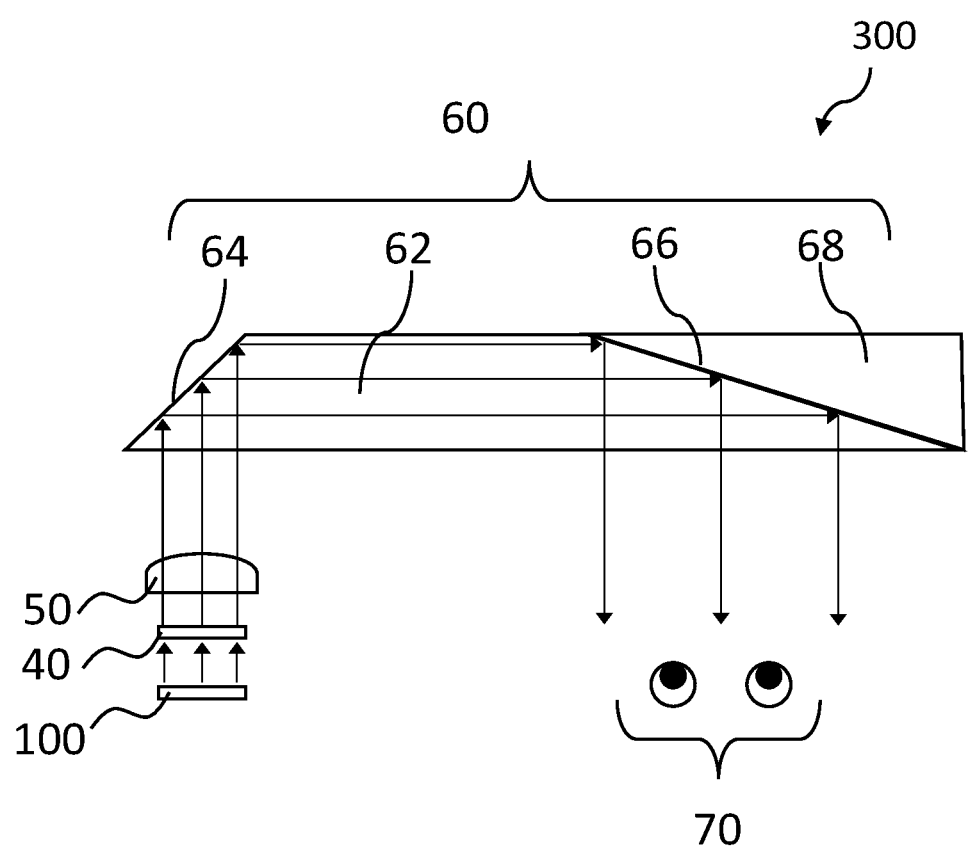
FIG. 5C is a schematic perspective view illustrating a configuration example of a virtual image display device according to the present embodiment.

Next, with reference to FIG. 5C, a configuration example of a virtual image display device according to the present embodiment will be described. FIG. 5C is a schematic perspective view illustrating a configuration example of a virtual image display device 300 according to the present embodiment. The virtual image display device 300 illustrated in FIG. 5C includes the light-emitting device 100, a liquid crystal on silicon (LCOS) 40, a collimating lens 50, and a light guide 60. The LCOS 40, the collimating lens 50, and the light guide 60 are located on an optical path of light emitted from at least one light-emitting device 100. The light guide 60 includes a light guide member 62 and an optical member 68. The light guide member 62 includes a first reflective portion 64 and a second reflective portion 66. The second reflective portion 66 is a surface opposite to the first reflective portion 64. Both of the reflective portions are disposed such that a plane including one reflective portion and another plane including the other reflective portion intersect each other. Arrows illustrated in FIG. 5C represent paths of light. Details of components other than the light-emitting device 100 of the virtual image display device 300 are disclosed in JP 2021-9404 A, for example.

The light emitted from at least one light-emitting device 100 is transmitted through the LCOS 40, collimated by the collimating lens 50, and incident on the light guide 60. The incident light is reflected at the first reflective portion 64 in the light guide 60, passes through the light guide member 62, is reflected by the second reflective portion 66, and is emitted from the light guide 60. The light emitted from the light guide 60 travels in a direction opposite to a direction of the light emitted from at least one light-emitting device 100, and is incident on eyes of a user 70. As a result, the user 70 can visually recognize an image displayed on the LCOS 40. The optical member 68 has a tapered outer shape in a plan view, and is disposed to face the second reflective portion 66 of the light guide member 62, and can thus increase light transmittance of the second reflective portion 66. Further, the optical member 68 transmits light traveling from a direction in which the user 70 makes an observation. With the optical member 68, the direction in which the user 70 makes an observation and a direction of a real image of the external world coincide with each other, so that visibility of the real image of the external world and an image displayed on the LCOS 40 can be improved. The light guide member 62 is preferably molded with a resin, for example, in consideration of processability. The same also applies to the optical member 68.

Specifically, the virtual image display device 300 can be used for a head-up display or a head-mounted display. In this application, a light-emitting diode can be used in the light-emitting element 10 included in at least one light-emitting device 100. The light-emitting diode has speckle noise lower than that of a laser diode, and can thus cause a displayed image to be easily visually recognized. Further, in at least one light-emitting device 100 according to the present embodiment, even when the light-emitting diode is used for the light-emitting element 10, the polarized light control member 20 can emit light having a proportion of the second polarization component greater than a proportion of the first polarization component. Accordingly, the light emitted from the light-emitting element 10 can be efficiently transmitted through the LCOS 40, and the transmitted light can cause an image to be displayed for the user 70.

Method for Manufacturing Light-Emitting Device

With reference to FIGS. 6A to 6D, an example of a method for manufacturing the light-emitting device 100 according to the present embodiment will be described below. In the following description, the configuration example illustrated in FIG. 2A is used as the light-emitting element 10 and the polarized light control member 20 that are included in the light-emitting device 100 according to the present embodiment.

Figure 6A:
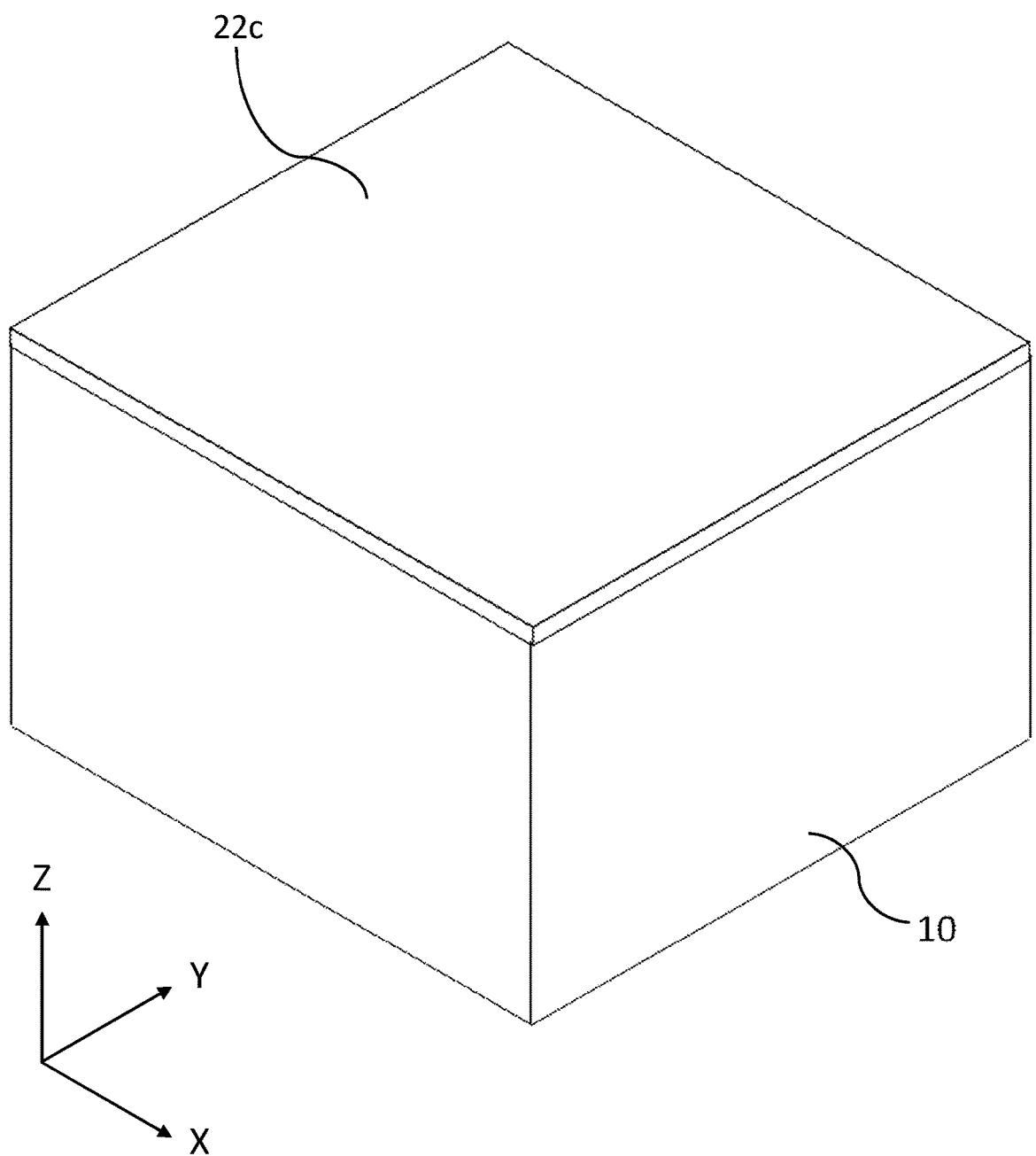
FIG. 6A is a diagram for explaining an example of steps in a method for manufacturing the light-emitting device according to the present embodiment.

As illustrated in FIG. 6A, a light-emitting element in which a first metal thin film 22c is formed on the light-emitting surface of the light-emitting element 10 is prepared. The first metal thin film 22c is formed on the light-emitting surface 10s of the light-emitting element 10 by, for example, sputtering or vacuum vapor deposition. The first metal thin film 22c may be formed of at least one metal selected from the group consisting of Au, Al, Ag, and Cu.

Figure 6B:
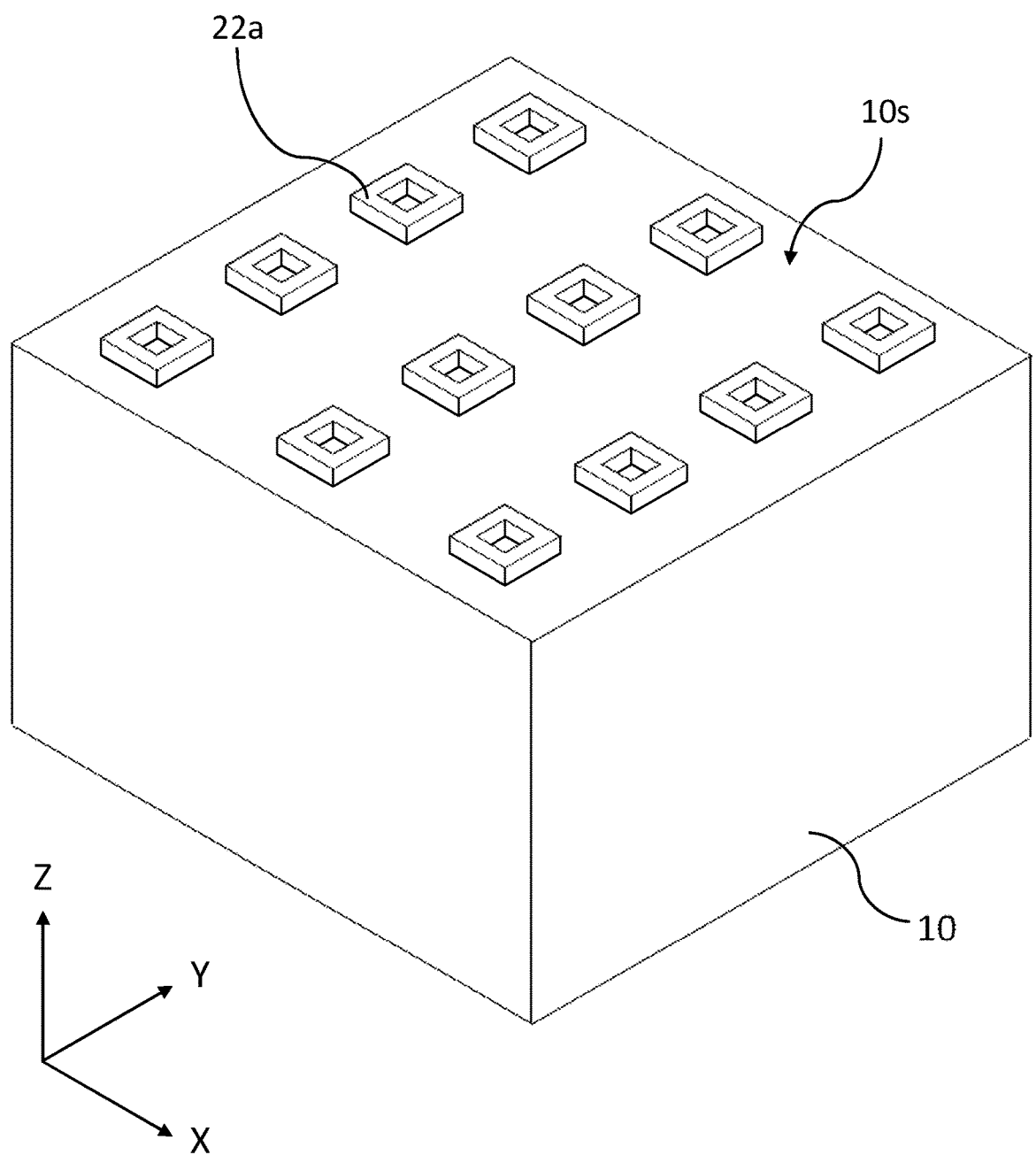
FIG. 6B is a diagram for explaining an example of steps in the method for manufacturing the light-emitting device according to the present embodiment.

In a subsequent step, as illustrated in FIG. 6B, by patterning the first metal thin film 22c using electron beam lithography, the plurality of first structures 22a are formed on the light-emitting surface 10s of the light-emitting element 10. An example of the patterning is as follows. A resist is formed on the first metal thin film 22c, and an unnecessary portion of the resist is removed by the electron beam lithography. A portion of the first metal thin film 22c exposed by removing the resist is removed by etching. Instead of using such an etching technique, patterning can also be performed by using a lift-off method. Further, as a patterning method using the electron beam lithography, direct drawing without providing a resist can be employed. As the electron beam lithography, for example, a variable rectangular drawing method, a partial batch exposure method, or the like can be used. In particular, the partial batch exposure is preferably used. In the partial batch exposure, a drawing time of a repeated pattern can be shortened by using a molded drawing plate in which a pattern to be repeatedly used has been formed.

Figure 6C:
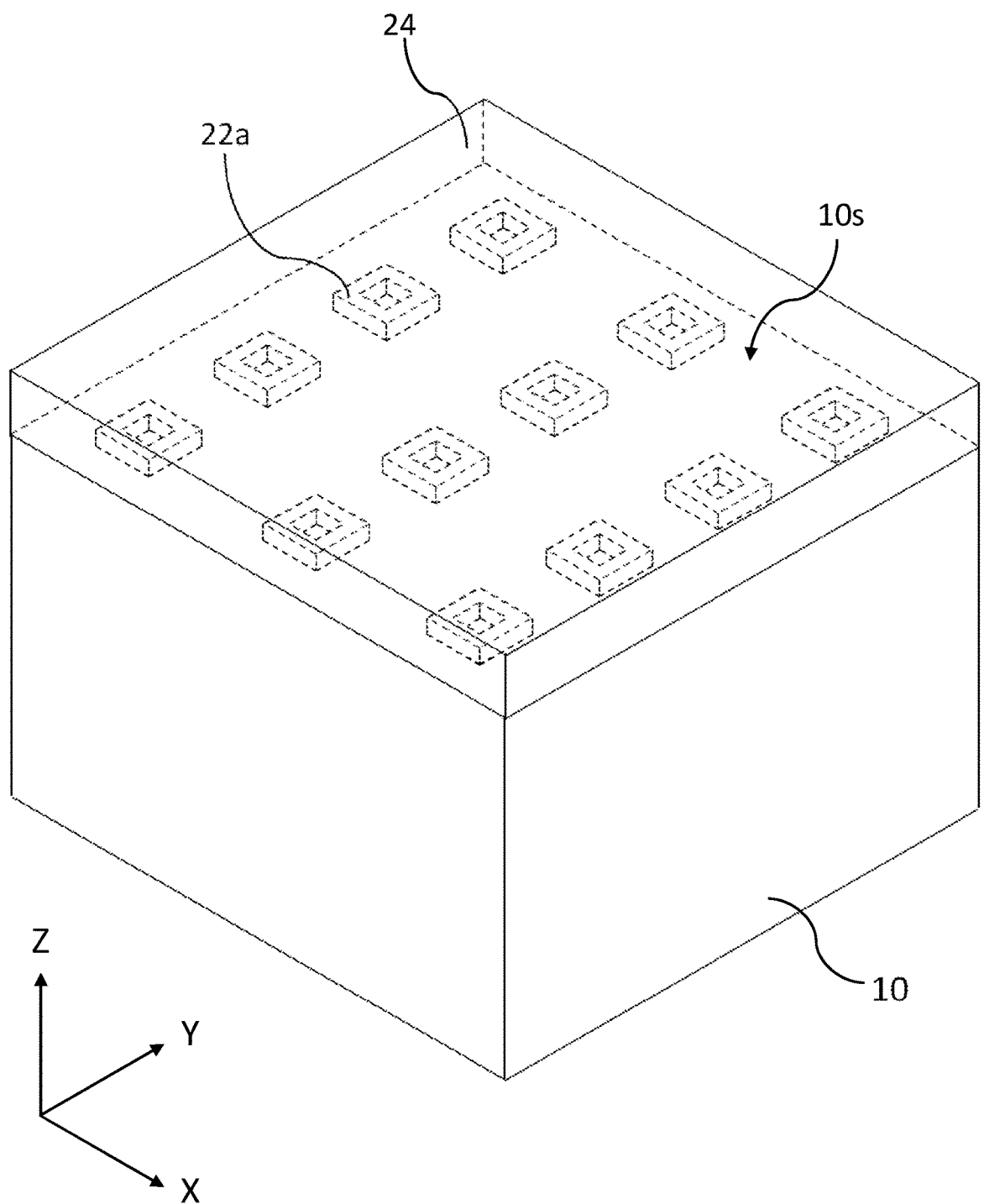
FIG. 6C is a diagram for explaining an example of steps in the method for manufacturing the light-emitting device according to the present embodiment.

In a subsequent step, as illustrated in FIG. 6C, the dielectric layer 24 covering the plurality of first structures 22a is formed. The dielectric layer 24 is formed of, for example, $SiO_2$, resin, gallium nitride, aluminum nitride, or aluminum oxide. The dielectric layer 24 can be formed by, for example, sputtering, CVD, or the like.

Figure 6D:
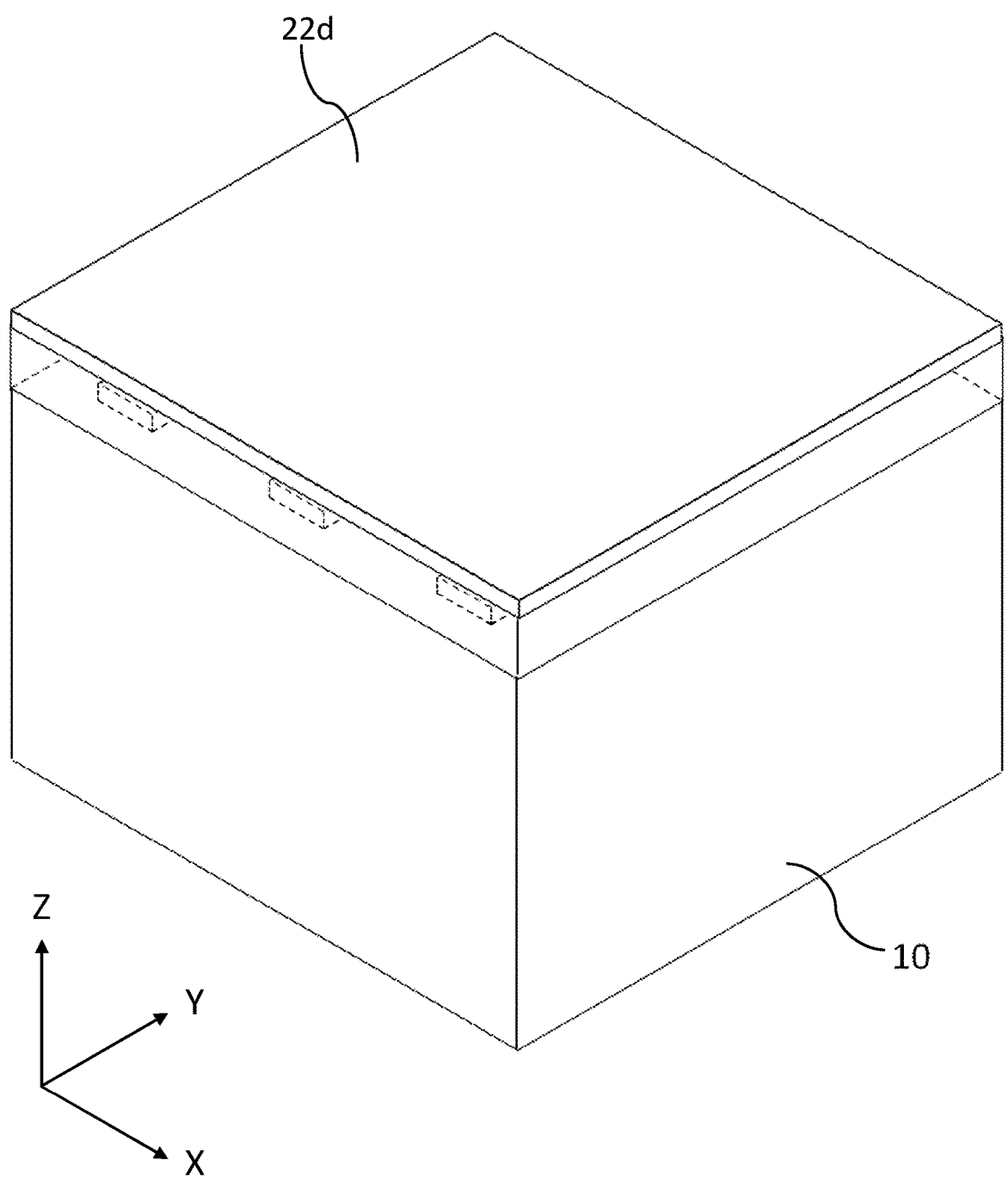
FIG. 6D is a diagram for explaining an example of steps in the method for manufacturing the light-emitting device according to the present embodiment.

In a subsequent step, as illustrated in FIG. 6D, a second metal thin film 22d is formed on the dielectric layer 24 by sputtering. A material of the second metal thin film 22d is the same as a material of the first metal thin film 22c.

In a subsequent step, as illustrated in FIG. 2A, the plurality of second structures 22b are formed on the dielectric layer 24 by patterning the second metal thin film 22d.

Through the steps described above, the light-emitting device 100 according to the present embodiment illustrated in FIG. 2A can be manufactured.

In the manufacturing method described above, the description is given using the drawings of an individual device for simplifying the description. Further, the light-emitting device including the light-emitting element 10 and the polarized light control member 20 can be obtained by forming a light-emitting portion including a light-emitting portion and a polarized light control portion using the manufacturing method described above, and then singulating the light-emitting portion into individual light-emitting devices.

Calculation Examples

Figure 7A:
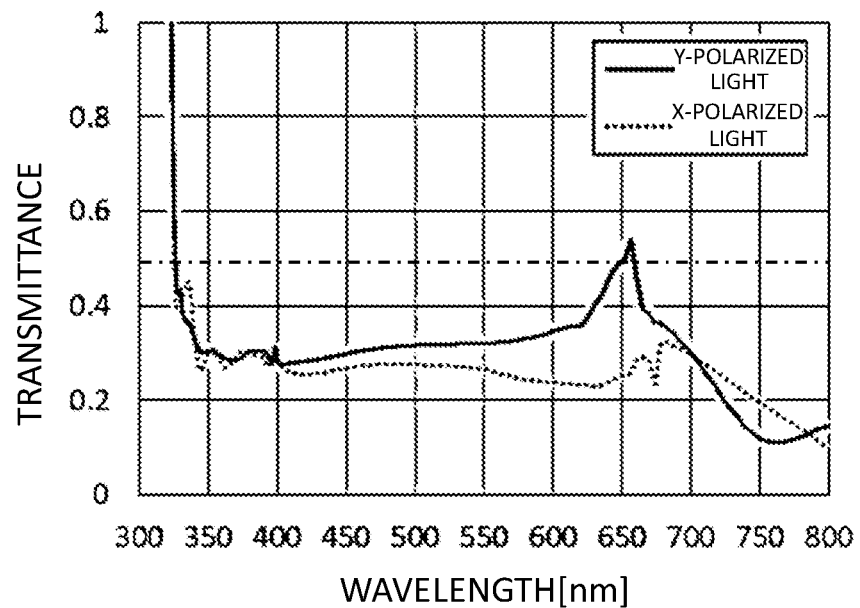
FIG. 7A is a graph showing energy conversion efficiency in first and second polarization components of transmitted light when unpolarized light is incident on the polarized light control member in Calculation Example 1.
Figure 7B:
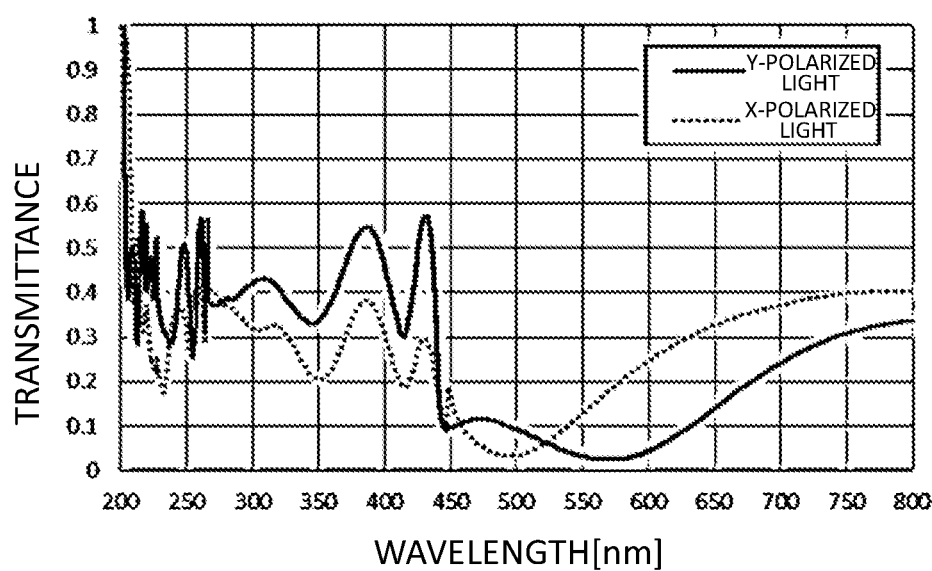
FIG. 7B is a graph showing energy conversion efficiency in the first and second polarization components of the transmitted light when the unpolarized light is incident on the polarized light control member in Calculation Example 2.
Figure 7C:
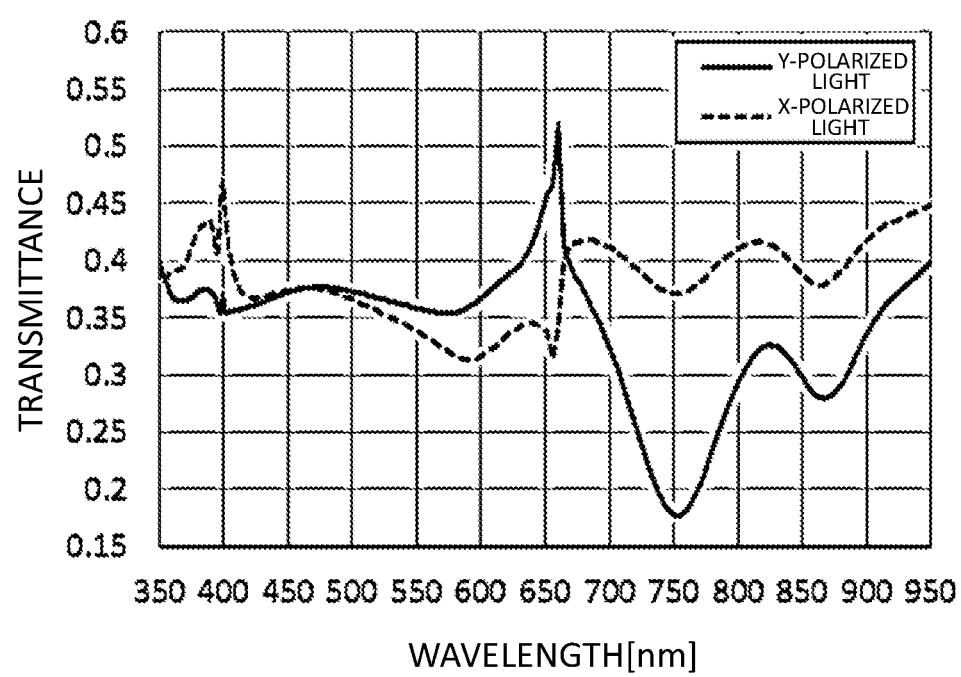
FIG. 7C is a graph showing energy conversion efficiency in the first and second polarization components of the transmitted light when the unpolarized light is incident on the polarized light control member in Calculation Example 3.

Described below with reference to FIGS. 7A to 7C are Calculation Examples 1 to 3 in which a transmittance was calculated in the first and second polarization components when the polarized light control member 20 converts unpolarized light into polarized light. The transmittance described in each of the calculation examples is the square of an electric field of the first polarization component and the second polarization component, and is converted into a transmittance of light. A finite difference time domain (FDTD) method was used for the calculation.

Calculation Example 1

In Calculation Example 1, the following model was set. The polarized light control member 20 includes a plurality of sets of the first structure 22a and the second structure 22b that are two-dimensionally arrayed, each set including the first structure 22a and the second structure 22b illustrated in FIG. 2B. As a material of the first structure 22a and the second structure 22b, Au was selected. In the first structure 22a, one side of the square was $L_{a1}=240$ nm, one side of the square of the hollow portion was $L_{a2}=120$ nm, and a thickness was $t_a=60$ nm. In the second structure 22b, of each of the first portion $22b_1$ and the second portion $22b_2$, the long side was $L_{b1}=150$ nm, the short side was $L_{b2}=120$ nm, a width of the long protruding portion was $L_{b3}=60$ nm, a width of the short protruding portion was $L_{b4}=60$ nm, and a thickness was $t_b=60$ nm. An arrangement interval in the Y direction between the first portion $22b_1$ and the second portion $22b_2$ that are included in the second structure 22b was $d_b=180$ nm. An arrangement interval in the Z direction between first structure 22a and the second structure 22b was $d_{ab}=80$ nm. An array pitch in the X direction of the plurality of sets of the first structure 22a and the second structure 22b was 660 nm, and an array pitch in the Y direction was 400 nm. The dielectric layer 24 was not considered in subsequent Calculation Examples including Calculation Example 1. This is because an influence of the dielectric layer 24 on the calculation is small.

Conditions of FDTD calculation were a spatial cell size of 5 nm and a time step of $9.4 \times 10^{-18}$ seconds. The X and Y directions were a periodic boundary condition, the Z direction was an absorption boundary condition (PML: Perfect Matched Layer), and the number of PML layers was 10. A dielectric constant dispersion of materials Au and Al was cited from the book "Handbook of Optical Constants of Solids" (written by Edward D. Palik). For example, a complex dielectric constant of Au at a wavelength of 652 nm was $\varepsilon r=0.29$ and $\varepsilon i=3.31$.

Calculation Example 2

For the polarized light control member 20 in Calculation Example 2, a model was set in a similar condition to that in Calculation Example 1 except for the following points, and calculation was performed. Al was selected as a material of the first structure 22a and the second structure 22b. In the first structure 22a, one side of the square was $L_{a1}=160$ nm, one side of the square of the hollow portion was $L_{a2}=80$ nm, and a thickness was $t_a=40$ nm. In the second structure 22b, of each of the first portion $22b_1$ and the second portion $22b_2$, the long side was $L_{b1}=100$ nm, the short side was $L_{b2}=80$ nm, a width of the long protruding portion was $L_{b3}=40$ nm, a width of the short protruding portion was $L_{b4}=40$ nm, and a thickness was $t_b=40$ nm. An arrangement interval in the Y direction between the first portion $22b_1$ and the second portion $22b_2$ that are included in the second structure 22b was $d_b=120$ nm. An arrangement interval in the Z direction between first structure 22a and the second structure 22b was $d_{ab}=120$ nm. An array pitch in the X direction of the plurality of sets of the first structure 22a and the second structure 22b was 440 nm, and an array pitch in the Y direction was 266 nm.

Calculation Example 3

Figure 3B:
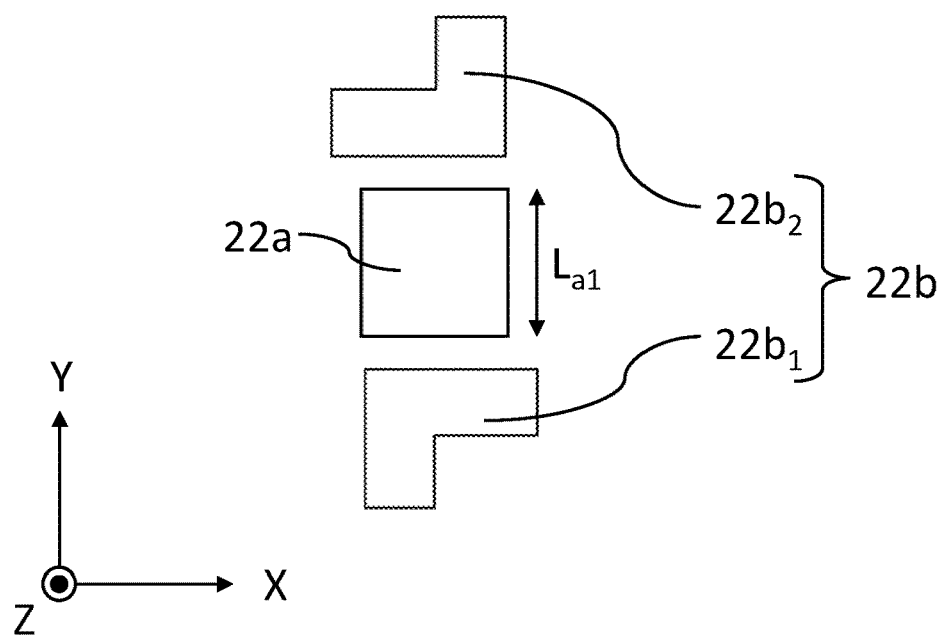
FIG. 3B is a schematic top view of the configuration illustrated in FIG. 3A.

The polarized light control member 20 in Calculation Example 3 includes a plurality of sets of the first structure 22a and the second structure 22b, each set including the first structure 22a and the second structure 22b illustrated in FIG. 3B. Calculation Example 3 is different from Calculation Example 1 in a shape of the first structure 22a. In the first structure 22a without having a hollow structure, one side of the square was $L_a=20$ nm, and a thickness was $t_a=60$ nm. Other materials and structural parameters in Calculation Example 3 were the same as those in Calculation Example 1.

FDTD Calculation

FIG. 7A is a graph showing a transmittance in the first and second polarization components of transmitted light when unpolarized light is incident on the polarized light control member 20 in Calculation Example 1. The first polarization component is X-polarized light, and the second polarization component is the Y-polarized light. The same also applies to the other Calculation Examples, and the first and second polarization components are also referred to as X-polarized light and Y-polarized light below. A solid line represents a transmittance of a Y-polarized light component, and a broken line represents a transmittance of an X-polarized light component. For the broken line in FIG. 7A, X-polarized light transmitted without conversion in a polarization direction and X-polarized light converted from Y-polarized light, of incident light are taken into consideration. Further, for the solid line in FIG. 7A, Y-polarized light transmitted without being converted and Y-polarized light converted from X-polarized light, of incident light are taken into consideration. The same also applies to results of Calculation Example 2 and Calculation Example 3 unless otherwise described. Energy of each of the first and second polarization components of incident unpolarized light is 50%. A horizontal dot-dash line illustrated in FIG. 7A represents that a transmittance is 50%. In the example illustrated in FIG. 7A, the calculation accuracy is low in a range of a wavelength of 350 nm or less, and thus a transmittance in this range is ignored.

As illustrated in FIG. 7A, a transmittance in the X-polarized light of the transmitted light was suggested to be less than 40% in a range of a wavelength from 350 nm to 800 nm. In contrast, a transmittance in the Y-polarized light of the transmitted light was suggested to exceed 50% in a range of a wavelength from 652 nm to 658 nm. A maximum transmittance in the Y-polarized light of the transmitted light was suggested to be 54% at a wavelength of 656 nm. At this time, a transmittance in the X-polarized light of the transmitted light was suggested to be 26%. This indicates that, of light having a wavelength of 656 nm, 54% of the energy of the Y-polarized light component is transmitted, and 26% of the X-polarized light component is transmitted. In other words, it indicates that a part of the X-polarized light component is converted into the Y-polarized light component, and thus the Y-polarized light component becomes greater than the X-polarized light component. Therefore, when a predetermined wavelength of unpolarized light emitted from the light-emitting element 10 is 655 nm, it is conceivable that polarized light having the highest transmittance can be obtained from the polarized light control member 20.

FIG. 7B is a graph showing a transmittance in the X-polarized light and the Y-polarized light of transmitted light when unpolarized light is incident on the polarized light control member 20 in Calculation Example 2. In the example illustrated in FIG. 7B, the calculation accuracy is low in a range of a wavelength of 300 nm or less, and thus a transmittance in this range is ignored. As illustrated in FIG. 7B, a transmittance in the X-polarized light of the transmitted light was equal to or less than 40% in a range of a wavelength from 300 nm to 800 nm. In contrast, a transmittance in the Y-polarized light of the transmitted light was suggested to exceed 50% in a range of a wavelength from 376 nm to 396 nm and a range of a wavelength from 426 nm to 435 nm. A maximum transmittance in the Y-polarized light of the transmitted light was suggested to be 57% at a wavelength of 431 nm. At this time, a transmittance in the X-polarized light of the transmitted light was suggested to be 30%. This means that, of light having a wavelength of 431 nm, 57% of the energy of the Y-polarized light component is transmitted, and 30% of the X-polarized light component is transmitted. In other words, it indicates that a part of the X-polarized light component is converted into the Y-polarized light component, and thus the Y-polarized light component becomes greater than the X-polarized light component. When a wavelength of unpolarized light emitted from the light-emitting element 10 is 430 nm, it is conceivable that polarized light having the highest transmittance can be obtained.

FIG. 7C is a graph showing a transmittance in the X-polarized light and the Y-polarized light of transmitted light when unpolarized light is incident on the polarized light control member 20 in Calculation Example 3. As illustrated in FIG. 7C, a transmittance in the X-polarized light of the transmitted light was suggested to be less than 50% in a range of a wavelength from 350 nm to 950 nm. In contrast, a transmittance in the Y-polarized light of the transmitted light was suggested to be 52% at a wavelength of 660 nm and to exceed 50%. At this time, a transmittance in the X-polarized light of transmitted light was suggested to be 34%. This indicates that, of light having a wavelength of 660 nm, 52% of the energy of the Y-polarized light component is transmitted, and 34% of the X-polarized light component is transmitted. In other words, it indicates that a part of the X-polarized light component is converted into the Y-polarized light component, resulting in having the Y-polarized light component greater than the X-polarized light component. When a wavelength of unpolarized light emitted from the light-emitting element 10 is 655 nm, it is thought that polarized light having the highest transmittance can be obtained from the polarized light control member 20.

As described in Calculation Examples 1 to 3, a wavelength having the highest transmittance depends on a material, a shape, a size, and an arrangement interval in the Z direction of a single set of the first structure 22a and the second structure 22b. By appropriately designing the structural parameters, a wavelength having the highest transmittance and a predetermined wavelength of light emitted from the light-emitting element 10 can coincide with each other.

The light-emitting device of the present disclosure can be applied to a white backlight for a liquid crystal panel, a polarization light source for a head-mounted display and a head-up display, or a monochromatic polarization light source, for example.

What is claimed is:

1. A light-emitting device comprising:
   at least one light-emitting element comprising a semiconductor layered portion and configured to emit light that has a predetermined wavelength and includes a first polarization component and a second polarization component; and
   at least one polarized light control member in contact with the at least one light-emitting element; wherein:
   the at least one polarized light control member comprises a first structure and a second structure positioned in order from a light-emitting element side;
   in the first structure and the second structure, a length in a height direction perpendicular to a light-emitting surface of the light-emitting element, a length in a vertical direction perpendicular to the height direction, and a length in a horizontal direction perpendicular to both of the height direction and the vertical direction are less than a length of the predetermined wavelength;
   a distance between the first structure and the second structure is less than the length of the predetermined wavelength;
   a ratio of a length of the second structure in the horizontal direction to a length of the second structure in the vertical direction is greater than 1; and
   the predetermined wavelength is in a range from a wavelength on a short side to a wavelength on a long side of a wavelength having an intensity that is half an intensity of a peak wavelength of light emitted from the at least one light-emitting element.

2. The light-emitting device according to any one of claim 1, wherein:
   the at least one polarized light control member comprises a dielectric layer covering the first structure; and
   the second structure is on the dielectric layer.

3. The light-emitting device according to claim 2, wherein:
   the at least one light-emitting element comprises a substrate;
   the substrate is located between the semiconductor layered portion and the polarized light control member; and
   a refractive index of the substrate is higher than a refractive index of the semiconductor layered portion and is lower than a refractive index of the dielectric layer.

4. The light-emitting device according to claim 1, wherein:

in a top plan view, portions of the first structure overlap portions of the second structure.

5. The light-emitting device according to claim 1, wherein:
the first structure and the second structure are formed of a metal.

6. A display comprising:
the light-emitting device according to any one of claim 1; and
a liquid crystal panel.

7. The light-emitting device according to claim 1, wherein:
a difference between the wavelength on the long side and the wavelength on the short side is 10 nm or greater and 50 nm or less.

8. The light-emitting device according to claim 2, wherein:
a difference between the wavelength on the long side and the wavelength on the short side is 10 nm or greater and 50 nm or less.

9. A light-emitting device comprising:
at least one light-emitting element comprising a semiconductor layered portion and configured to emit light that has a predetermined wavelength and includes a first polarization component and a second polarization component; and
at least one polarized light control member in contact with the at least one light-emitting element; wherein:
the at least one polarized light control member comprises a first structure and a second structure positioned in order from a light-emitting element side;
in the first structure and the second structure, a length in a height direction perpendicular to a light-emitting surface of the light-emitting element, a length in a vertical direction perpendicular to the height direction, and a length in a horizontal direction perpendicular to both of the height direction and the vertical direction are less than a length of the predetermined wavelength;
a distance between the first structure and the second structure is less than the length of the predetermined wavelength;
a ratio of a length of the second structure in the horizontal direction to a length of the second structure in the vertical direction is greater than 1;
the at least one polarized light control member comprises a dielectric layer covering the first structure; and
the second structure is on the dielectric layer.

10. The light-emitting device according to claim 9, wherein:
the at least one light-emitting element comprises a substrate;
the substrate is located between the semiconductor layered portion and the polarized light control member; and
a refractive index of the substrate is higher than a refractive index of the semiconductor layered portion and is lower than a refractive index of the dielectric layer.

11. The light-emitting device according to claim 9, wherein:
in a top plan view, portions of the first structure overlap portions of the second structure.

12. The light-emitting device according to claim 9, wherein:
the first structure and the second structure are formed of a metal.

13. A display comprising:
the light-emitting device according to any one of claim 9; and
a liquid crystal panel.

* * * * *